United States Patent
Kigawa et al.

(10) Patent No.: US 7,902,481 B2
(45) Date of Patent: Mar. 8, 2011

(54) METHOD OF MANUFACTURING SEALED ELECTRONIC COMPONENT AND SEALED ELECTRONIC COMPONENT

(75) Inventors: Keisuke Kigawa, Hanno (JP); Haruyuki Hiratsuka, Komoro (JP); Tomohisa Wada, Nagano (JP)

(73) Assignees: Citizen Holdings Co., Ltd, Tokyo (JP); Citizen Finetech Miyota Co., Ltd, Nagano (JP)

( * ) Notice: Subject to any disclaimer, the term of this patent is extended or adjusted under 35 U.S.C. 154(b) by 1192 days.

(21) Appl. No.: 11/547,323

(22) PCT Filed: Mar. 30, 2005

(86) PCT No.: PCT/JP2005/006193
§ 371 (c)(1),
(2), (4) Date: Oct. 2, 2006

(87) PCT Pub. No.: WO2005/096373
PCT Pub. Date: Oct. 13, 2005

(65) Prior Publication Data
US 2007/0199925 A1      Aug. 30, 2007

(30) Foreign Application Priority Data
Mar. 31, 2004   (JP) ............................. 2004-102803
Sep. 28, 2004   (JP) ............................. 2004-282817

(51) Int. Cl.
*H01L 21/50*   (2006.01)
*B23K 26/20*   (2006.01)

(52) U.S. Cl. ............................. 219/121.17; 219/121.66; 257/678; 257/708; 148/525

(58) Field of Classification Search ............................... 219/121.63–121.66, 121.85, 121.16, 121.17; 257/678, 708; 148/525
See application file for complete search history.

(56) References Cited

U.S. PATENT DOCUMENTS

| | | | | | |
|---|---|---|---|---|---|
| 2,510,073 | A | * | 6/1950 | Clark | 336/30 |
| 2,686,342 | A | * | 8/1954 | Eustachio | 52/204.52 |
| 4,005,360 | A | * | 1/1977 | Ott | 324/230 |
| 4,879,448 | A | * | 11/1989 | Folger et al. | 219/121.63 |
| 5,102,029 | A | * | 4/1992 | Richardson et al. | 228/124.1 |
| 5,303,081 | A | * | 4/1994 | Totsuka et al. | 359/213.1 |
| 6,108,402 | A | * | 8/2000 | Chornenky | 378/119 |
| 6,921,970 | B2 | * | 7/2005 | Shiomi et al. | 257/704 |
| 2005/0215907 | A1 | * | 9/2005 | Toda et al. | 600/459 |

FOREIGN PATENT DOCUMENTS

DE    19805837 C1 *  7/1999
JP    356056749 A *  5/1981

(Continued)

*Primary Examiner* — Samuel M Heinrich
(74) *Attorney, Agent, or Firm* — Sughrue Mion, PLLC

(57) ABSTRACT

A method of manufacturing a sealed electronic component, which can seal a housing in a high-vacuum state while preventing enclosure of a gas within the housing, as well as achieving the improvement in manufacturing efficiency. According to the method, after forming an unwelded section by a primary welding process step, including a first beam irradiation process step and a second beam irradiation process step, annealing treatment is performed in an annealing process step by irradiating an electron beam to a predetermined portion on a locus of the electron beam formed in the first beam irradiation process step. The locus may be on a housing or a lid.

22 Claims, 12 Drawing Sheets

FOREIGN PATENT DOCUMENTS

| | | | |
|---|---|---|---|
| JP | 357143885 A | * | 9/1982 |
| JP | 03151694 A | * | 6/1991 |
| JP | 5-243411 A | | 9/1993 |
| JP | 96012774 B2 | * | 2/1996 |
| JP | 408141762 A | * | 6/1996 |
| JP | 2000-196162 A | | 7/2000 |
| JP | 2000-223604 A | | 8/2000 |
| JP | 2000-277639 A | | 10/2000 |
| JP | 2001-257279 A | | 9/2001 |
| JP | 2002-141427 A | | 5/2002 |
| JP | 2002-359311 A | | 12/2002 |
| JP | 2003-283287 A | | 10/2003 |

* cited by examiner

AMOUNT OF INCREASE IN EQUIVALENT SERIES RESISTANCE CI VALUE AFTER BAKING TEST

|  | EXAMPLE | COMPARATIVE |
|---|---|---|
| MAXIMUM (kΩ) | 6 | 18 |
| MINIMUM (kΩ) | 5 | 9 |
| AVERAGE (kΩ) | 5 | 16 |
| AVERAGE OF CI VALUE AFTER BAKING TEST (kΩ) | 42 | 63 |

METHOD OF MANUFACTURING SEALED ELECTRONIC COMPONENT AND SEALED ELECTRONIC COMPONENT

TECHNICAL FIELD

The present invention relates to a method of manufacturing a sealed electronic component constituted by housing an electronic component, such as a quartz oscillator, a piezoelectric vibrator, or an IC chip in a housing and then hermetically sealing the housing with a lid, and the sealed electronic component manufactured by the method.

BACKGROUND ART

An electronic component, e.g., a quartz oscillator, is housed within a package which includes a housing made of such as a ceramic and a lid for sealing an opening of the housing, for example, in a hermetic state so that a sealed electronic component is constituted.

While, as a sealing method of the sealed electronic component, the seam welding has been applied conventionally, the method includes the steps of brazing an expensive Kovar ring via a silver brazing material on the opening of the housing and of seam-welding the lid thereon, requiring a number of processes and high cost. In addition, it has been difficult to miniaturize the sealed electronic component substantially. Moreover, while there is a vacuum furnace welder to weld the lid to the housing by heating the housing in vacuum and fusing a sealing material, which is excellent in terms of the cost and productivity, it welds the sealing material over the entire circumference at one time, so that outgas from the sealing material produced upon welding is confined in the interior of the package, causing a problem of reduction in a degree of vacuum. As a result, sealing by the electron beam welding is performed instead of such as the seam welding.

FIG. 28 is a plan view for describing the method of the electron beam welding, which illustrates a locus of an electron beam 53 irradiated from a lid 51 side. As shown in FIG. 28, in the electron beam welding, a sealing material 52, such as a brazing metal material, is disposed between a housing 50 and the lid 51 that is arranged on the upper surface of the housing 50 so as to seal an opening of the housing 50. The electron beam 53 is then sequentially scanned in a predetermined direction from the lid 51 side along the rim of the lid 51 to perform the electron beam irradiation. Here, the electron beam 53 is irradiated so that the starting point and the terminal point of the beam irradiation coincide at a point P. With such irradiation of the electron beam 53, the sealing material 52 is heated and melted, thereby the housing 50 and the lid 51 are welded by the sealing material 52, resulting in a sealed electronic component 54 which houses an electronic component (not shown) being sealed.

Meanwhile, in the foregoing electron beam welding, if gas is generated upon the sealing material 52, e.g., the brazing metal material, being melted and the gas is enclosed within the sealed electronic component 54, it affects the characteristics or reliability of the electronic component (not shown). For example, with the sealed electronic component 54 constituted by housing a quartz oscillator, the gas produced upon welding increases an equivalent series resistance value (CI value) of the quartz oscillator, which in turn decreases the oscillation property of the quartz oscillator. Therefore, in the electron beam welding, it is necessary to discharge the gas produced upon the sealing material 52 being melted, and to prevent the gas from being enclosed within the sealed electronic component 54.

As a method of preventing the gas from being enclosed within the sealed electronic component 54, there is a method, as shown in FIGS. 29 and 30, which irradiates, instead of irradiating over the entire rim of the lid 51 at one time, respective predetermined areas of the circumference of the lid 51 in multiple times with the electron beam 53 (see, for example, Patent Documents 1 through 4). In this method, firstly, as shown in FIG. 29, a predetermined area is set as a non-irradiation area 55 preliminarily, and the electron beam 53 is scanned sequentially for the areas other than this in a predetermined direction along the rim of the lid 51 to perform the beam irradiation. Here, it is set so that the non-irradiation area 55 is formed between the points P and Q, and the electron beam 53 is irradiated from the point P as the starting point to the point Q as the terminal point.

Since the non-irradiation area 55 is not irradiated with the electron beam 53, the sealing material 52 thereon is not melted and the area remains unwelded. Hereinafter, the unwelded area formed in the non-irradiation area 55 is referred to as an unwelded section 55'. This unwelded section 55' can be used as a gas outlet. After discharging the gas through the unwelded section 55', the unwelded section 55' is irradiated with the electron beam 53 so as to weld the section as shown in FIG. 30. In welding the unwelded section 55', the electron beam 53 is scanned in the same direction as the case of FIG. 29 which welded a section other than this to perform the beam irradiation. Here, the electron beam 53 is irradiated from the point Q as the starting point to the point P as the terminal point. According to the foregoing method, the sealed electronic component 54 can be sealed while preventing the gas from being enclosed within the housing 50.

In addition, since the housing 50 made of a ceramic has such as atmospheric impurities or moisture (hereinafter, these are referred to as a volatile component collectively) on its surface for example, the volatile component needs to be removed. In Patent Document 2, for example, the housing 50, the sealing material 52, and the lid 51 are pre-heated before irradiating the electron beam to remove the volatile component from the respective members.

Moreover, in Patent Document 3, by heating to dry the sealed electronic component 54 with the unwelded section 55' being formed, gas particles adhered to the housing 50 and the lid 51 are effectively removed.

Patent Document 1: Japanese Patent Laid-open Publication No. 2000-196

Patent Document 2: Japanese Patent Laid-open Publication No. 2000-223604

Patent Document 3: Japanese Patent Laid-open Publication No. 2001-257279

Patent Document 4: Japanese Patent Laid-open Publication No. 2002-141427

DISCLOSURE OF INVENTION

Problem to be Solved by the Invention

In the method of heating to dry the sealed electronic component 54 in such as a heating furnace in order to remove the volatile component adhered to the housing 50, the lid 51, or the like, it is necessary to arrange the heating furnace adjacent to an electron beam device, so that an apparatus becomes large-scale and causes the increase in apparatus cost. In addition, such a method requires, after heating to dry the sealed electronic component 54 in the heating furnace for several hours, the processes of cooling the sealed electronic component 54 and moving it from the heating furnace to the beam device, which respectively need time, resulting in the increase in takt time and the decrease in manufacturing efficiency.

Meanwhile, in the electron beam welding to discharge the gas by forming the unwelded section 55' as described above, it is difficult to stop the electron beam 53 instantly at the point Q used as the one end of the unwelded section 55'. For this reason, by increasing the speed of the beam while maintaining an output level of the irradiation constant, for example, it is necessary to perform a termination processing of the unwelded section 55' at the point Q. Accordingly, in the stopping operation at the point Q of the electron beam 53 upon forming the unwelded section 55' illustrated in FIG. 29, an area of the unwelded section 55' beyond the point Q and in the vicinity of the point P is irradiated with a small amount of the electron beam 53 before the irradiation of the electron beam 53 is stopped completely, thereby the sealing material 52 in the unwelded section 55' (i.e., the area between the points P and Q), which is not otherwise intended to be melted, may be melted. Moreover, although the electron beam 53 is stopped, the sealing material 52 in the unwelded section 55' may be melted under the influence of such as afterheat of the beam.

As a result of the sealing material 52 of the unwelded section 55' being melted as well like this, it becomes difficult to form the unwelded section 55' precisely as designed. Here, particularly in order to prevent the gas from being enclosed in the sealed electronic component 54 as much as possible, it is preferred to reduce the width W of the unwelded section 55', and, for that purpose, it needs to control accurately the positions of the points P and Q as the ends of the unwelded section 55'. Accordingly, if the electron beam 53 cannot be stopped accurately at the point Q as described above and thus it is difficult to control the width W of the unwelded section 55', enclosure of the gas within the sealed electronic component 54 cannot be prevented substantially, which may consequently cause the degradation in such as the characteristics of the electronic component (not shown) within the sealed electronic component 54.

The present invention is, in order to solve the foregoing problems of the conventional art, intended to provide the method of manufacturing the sealed electronic component, which can seal the housing in a high-vacuum state while preventing enclosure of the gas within the housing, as well as achieving the improvement in manufacturing efficiency, and the sealed electronic component manufactured by the manufacturing method.

Means For Solving Problem

To solve the problem described above and to achieve the object, a method of manufacturing a sealed electronic component according to the present invention includes a step of disposing a lid on a rim of an opening of a housing that has the opening and houses an electronic component within a housing portion therein (hereinafter, "housing") through the opening—via a sealing material for joining the housing with the lid that covers the opening of the housing (hereinafter, "lid"); an annealing step of irradiating at least one of the housing and the lid with a beam; and a step of melting the sealing material to join the housing with the lid.

According to the configuration, the annealing process enables to effectively discharge a gas derived from volatile component adhered to such as the housing or the lid from a communicating section. Thereby, it becomes possible to achieve a good degree of vacuum in the sealed electronic component, resulting in the improvement being achieved in the characteristics or reliability of the electronic component within the sealed electronic component. In particular, according to the configuration, the beam is directly irradiated to the housing and the lid which constitute the sealed electronic component in the annealing process, so that it becomes possible to carry out high temperature heating of the sealed electronic component efficiently, enabling to subject to the annealing treatment in time substantially shorter than conventionally required.

Moreover, in the annealing process, it becomes possible to cool the sealed electronic component in a short time after stopping the beam irradiation. Consequently, it is not necessary to provide a separate cooling process and to take time for it. Furthermore, the annealing process is performed by the beam irradiation here, it becomes possible to perform the annealing process and a beam-welding process of the communicating section continuously within the same processing chamber maintained at a vacuum state. Consequently, an arrangement for the annealing treatment, such as the processing chamber for the annealing treatment for example, becomes unnecessary, while conveyance for example of the sealed electronic component between both processes becomes unnecessary. Therefore, the apparatus cost can be reduced while achieving the improvement in the manufacturing efficiency of the sealed electronic component, and particularly these effects can be achieved more effectively by performing the annealing process and the beam-welding process of the communicating section using the same beam.

Moreover, according to the method of manufacturing the sealed electronic component of the present invention, in the above invention, at the annealing step, one or plural points of a bottom wall of the housing are irradiated with the beam. Moreover, according to the method of manufacturing the sealed electronic component of the present invention, in the above invention, at the annealing step, one or plural points of one of side walls of the housing are irradiated with the beam. Moreover, according to the method of manufacturing the sealed electronic component of the present invention, in the above invention, at the annealing step, one or plural points of plural side walls of the housing are irradiated with the beam.

According to these configurations, it becomes possible to perform heating efficiently in the annealing process. Particularly when irradiating the beam to plural points of the bottom wall and the side wall of the housing, as well as when irradiating the beam to plural side walls, heating efficiency is further improved.

Moreover, according to the method of manufacturing the sealed electronic component of the present invention, in the above invention, at the annealing step, the beam is irradiated intermittently in multiple times. According to the configuration, it becomes possible to reduce a damage which the sealed electronic component receives with the heat generated upon irradiating the beam in the annealing process. Consequently, it becomes possible to acquire the sealed electronic component of an excellent quality.

Moreover, according to the method of manufacturing the sealed electronic component of the present invention, in the above invention, at the annealing step, a laser is irradiated as the beam. According to the configuration, it becomes possible to reduce the damage which the sealed electronic component receives with the heat generated upon irradiating the beam in the annealing process. Consequently, it becomes possible to acquire the sealed electronic component of an excellent quality.

Moreover, according to the method of manufacturing the sealed electronic component of the present invention, in the above invention, the housing and the lid are joined by melting the sealing material while at least partially leaving a communicating section between the housing portion and the exterior before the annealing step, and the communicating section is sealed after the annealing step.

Moreover, according to the method of manufacturing the sealed electronic component of the present invention, in the above invention, the housing has a through hole preliminarily as the communicating section, and the method further includes a through hole sealing material filling step of filling the through hole with a through hole sealing material either before or after the annealing step, in which the through hole sealing material is irradiated with the beam so as to fill and seal the through hole by the through hole sealing material which is melted.

Moreover, according to the method of manufacturing the sealed electronic component of the present invention, in the above invention, the through hole is disposed in the bottom wall of the housing and an externally connected electrode is disposed in the bottom wall of the housing, and at the annealing step, an area of the bottom wall except for a formation area of the through hole and a disposition area of the externally connected electrode is irradiated with the beam.

According to the configuration, it becomes possible to discharge the gas generated in the annealing process through the through hole of the housing. Thereby, it becomes possible to achieve the good degree of vacuum in the sealed electronic component, resulting in the improvement being achieved in the characteristics or reliability of the electronic component within the sealed electronic component.

Moreover, a method of manufacturing a sealed electronic component, includes at least: a step of disposing a lid on a rim of an opening of a housing which has the opening and houses an electronic component within a housing portion therein (hereinafter, "housing") through the opening via a sealing material for joining the housing with the lid which covers the opening of the housing (hereinafter, "lid"); a primary welding step of irradiating a joining portion of the housing and the lid joined by the sealing material with a first beam except for a predetermined partial area to weld-seal the housing and the lid by melting the sealing material of an area except for the partial area, while forming an unwelded section as a communicating section between the housing portion of the housing and the exterior; an annealing step of irradiating at least one of the housing and the lid with a second beam for the sealed electronic component which is unsealed in the state where the unwelded section formed by the primary welding step is maintained; and a secondary welding step of weld-sealing the unwelded section by irradiating the unwelded section with the third beam after a predetermined time is elapsed for discharging a gas within the housing from the unwelded section.

According to the configuration, with the annealing process, it becomes possible to effectively discharge the gas derived from the volatile component adhered to the housing or generated in the primary welding process from the unwelded section. Thereby, it becomes possible to achieve the good degree of vacuum in the sealed electronic component, resulting in the improvement being achieved in the characteristics or reliability of the electronic component within the sealed electronic component.

Moreover, according to the method of manufacturing the sealed electronic component of the present invention, in the above invention, the annealing step utilizes the same beam as the first beam used in the primary welding step as the second beam to irradiate one or plural points on an irradiation locus of the first beam at the primary welding step so as to trace the locus of the first beam. According to the configuration, the locus of the beam formed in the annealing process coincides with the beam locus formed in the primary welding process. Consequently, a good appearance can be realized in the completed sealed electronic component.

Moreover, according to the method of manufacturing the sealed electronic component of the present invention, in the above invention, at least the first beam and the second beam are an electron beam or a laser. According to the configuration, the electron beam is irradiated within the processing chamber in a vacuum state, and the primary welding process and the annealing process are continuously performed, resulting in the gas being discharged immediately from the interior of the sealed electronic component to the processing chamber. Moreover, since the annealing process and the primary welding process are performed using the same electron beam machining device, the apparatus cost can be reduced while achieving the improvement in the manufacturing efficiency of the sealed electronic component.

Moreover, according to the method of manufacturing the sealed electronic component of the present invention, in the above invention, an output value of the second beam used at the annealing step is lower than an output value of the first beam used at the primary welding step. According to the configuration, it becomes possible to reduce the damage which the sealed electronic component receives with the heat generated upon irradiating the beam in the annealing process. Consequently, it becomes possible to acquire the sealed electronic component of the excellent quality. Moreover, it becomes possible to prevent the sealing material from being melted in the annealing process, enabling to prevent an unintended weld-sealing.

Moreover, according to the method of manufacturing the sealed electronic component of the present invention, in the above invention, at the primary welding step, the irradiation of the first beam is performed in two or more times so as to form the unwelded section between a starting point of first beam irradiation and a starting point of second beam irradiation with the both starting points as both ends.

For example, according to the method of manufacturing the sealed electronic component of the present invention, in the above invention, the primary welding step includes: a first beam irradiation step of scanning the first beam sequentially from a first point to be one end of the unwelded section as a starting point in a predetermined direction along a circumference of the lid to a third point located in the upper stream of the beam scanning direction than a second point to be the other end of the unwelded section to irradiate the first beam so as to weld-seal from the first point to the third point; and a second beam irradiation step of scanning the first beam sequentially from the second point to be the other end of the unwelded section as a starting point in a direction opposed to the predetermined direction along the circumference of the lid to at least the third point as a terminal point of the first beam irradiation step to irradiate the first beam so as to form the unwelded section by weld-sealing from the second point to the third point.

According to the configuration, it becomes possible to form the unwelded section with the starting points of the beam irradiation as both ends, enabling formation of the unwelded section at a desired position and with a desired width accurately compared to the conventional method in which an end is constituted by the terminal point of the electron beam irradiation. Consequently, it becomes possible to further improve the degree of vacuum in the sealed electronic component, resulting in the further improvement being achieved in the characteristics or reliability of the electronic component within the sealed electronic component.

Moreover, according to the method of manufacturing the sealed electronic component of the present invention, in the above invention, the housing has a square shape, and, at the first welding step, positions of the first point, the second point, and the third point are set so that four corners of the housing are included between the first point and the third point or between the second point and the third point. According to the configuration, the hermetic sealing property in an area other than the unwelded section is improved, resulting in the improvement in the efficiency percentage being achieved.

Moreover, the method of manufacturing the sealed electronic component according to the present invention, in the above invention, further includes a step of tacking the lid to the housing before the primary welding step. At the first and second beam irradiation steps of the primary welding step, the first point as the starting point of the first beam irradiation and the second point are positioned in an area except for a tacking section of the lid and the housing. According to the configuration, it becomes possible to perform the beam irradiation while preventing a displacement of the lid disposed on the housing, resulting in the improvement in the yield and the productive efficiency.

Moreover, according to the method of manufacturing the sealed electronic component of the present invention, in the above invention, at the secondary welding step, the weld-sealing is performed by irradiating an electron beam or a laser as the third beam. According to the configuration, although the gas is generated in the housing by irradiating the electron beam or the laser upon weld-sealing, it becomes possible to perform the weld-sealing while discharging the gas from the unwelded section to maintain a high-vacuum state. Here, although it is difficult to control the terminal point of the beam irradiation in the irradiation of the electron beam or the laser, the both ends of the unwelded section are configured by the starting points of the beam irradiation according to the present invention as described above, and thus it becomes possible to form the unwelded section readily and precisely with the desired width and at the desired position, enabling to perform the weld-sealing while maintaining the better high-vacuum state. Particularly, when the laser is used in the secondary welding process, it becomes possible by locally irradiating the unwelded section having small width with the laser to perform point sealing of the unwelded section.

Moreover, according to the method of manufacturing the sealed electronic component of the present invention, in the above invention, the weld-sealing by irradiating the first beam or the third beam at one of the primary welding step and the secondary welding step includes: a preheating beam irradiation step as a preheating step of heating the housing, the lid, and the sealing material to a predetermined temperature by irradiating the first beam or the third beam; and a welding beam irradiation step of melting the sealing material to weld the housing and the lid via the sealing material by irradiating one of the first beam and the third beam. Moreover, according to the method of manufacturing the sealed electronic component of the present invention, in the above invention, the preheating beam irradiation step irradiates a welding area with the first beam or the third beam in multiple times. According to these configurations, it becomes possible to perform the weld-sealing reliably at a desired section along the rim of the lid.

Moreover, the method of manufacturing the sealed electronic component according to the present invention is characterized in disposing the sealing material preliminarily on the housing in the foregoing invention. According to the configuration, the need is eliminated to hold the housing and the lid using a fixture upon irradiating the beam as has been conventionally employed.

Furthermore, the method of manufacturing the sealed electronic component according to the present invention is characterized by the electronic component being a quartz oscillator in the foregoing invention. According to the configuration, the interior of the sealed electronic component is maintained at the high-vacuum state, resulting in the reduction in the equivalent series resistance value (CI value) of the quartz oscillator being achieved. Consequently, it becomes possible to achieve the sealed electronic component provided with the quartz oscillator which has the uniform quality and the stable oscillation property.

Moreover, a sealed electronic component according to the present invention is characterized by being manufactured by the method of manufacturing the sealed electronic component of the above invention. According to the configuration, the interior of the housing is maintained at the high-vacuum state, and thus it becomes possible to achieve the good device property and the stable high reliability.

Effect Of The Invention

According to the method of manufacturing a sealed electronic component and the sealed electronic component in accordance with the present invention, it becomes possible to prevent a gas generated from a sealing material upon welding, or atmospheric impurities or moisture (i.e., volatile component) adhered to a housing or a lid of the sealed electronic component from remaining in the sealed component, thereby enabling the interior of the sealed electronic component to be a high-vacuum state. As a result, the electronic component housed inside does not change over time due to the gas generated upon welding or derived from the volatile component, so that the degradation in the characteristics or the reliability of the electronic component can be prevented.

Moreover, since an annealing treatment of the housing or the lid can be performed using the same beam as the beam used in a welding process, a welding equipment can also serve as a conventional heating furnace as it is. In other words, it eliminates the need of a heating device and a conveying tray for bulk heating of the housing or the lid over a long time, as well as a water-cooling device and a conveying tray for cooling the bulk-heated members thereafter. Consequently, the reduction in apparatus cost is achieved while a manufacturing process can be simplified so that the reduction in a takt time being achieved. Consequently, the sealed electronic component with good characteristics and high reliability can be manufactured at good efficiency.

EXPLANATIONS OF LETTERS OR NUMERALS

Figure 1:
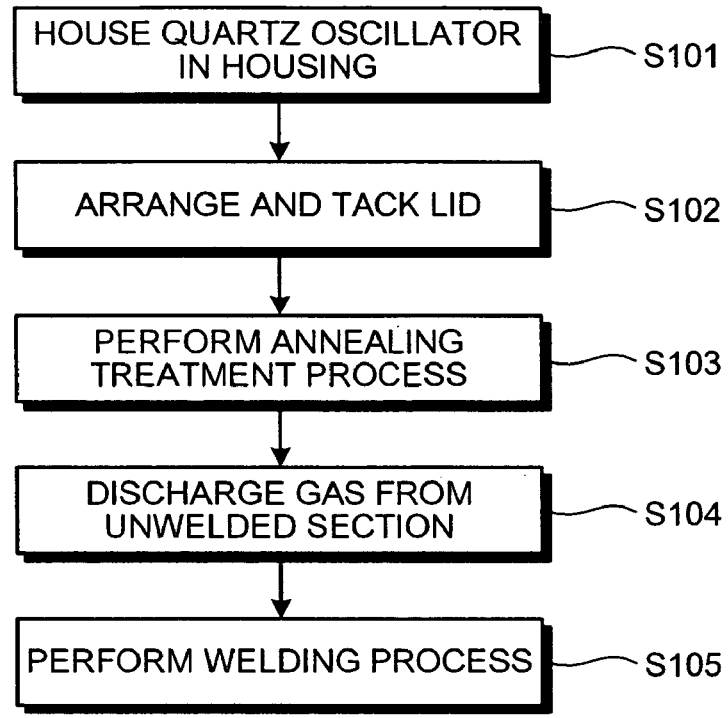
FIG. 1 is a flowchart illustrating respective processes in a manufacturing method of a package according to a first embodiment of the present invention.

1: quartz oscillator
2: housing
3: lid
4: sealing material
5: support
6: bonding material
10A, 10B, 10C, and 10D: electron beam
15: unwelded section
20: package
500: through hole
600: through hole sealing material

BEST MODE(S) FOR CARRYING OUT THE INVENTION

Hereinafter, exemplary embodiments of a manufacturing method of a sealed electronic component and the sealed electronic component manufactured by the manufacturing method according to the present invention will be described in detail with reference to the accompanying drawings. Herein, as the sealed electronic component, there is illustrated a sealed quartz oscillator component wherein a quartz oscillator device, which is an electronic component, is housed and sealed in a housing, and particularly there is described the sealed component where the quartz oscillator is surface mounted. In addition, the sealed quartz oscillator component will be simply referred to as a package hereinafter.

First Embodiment

Figure 2:
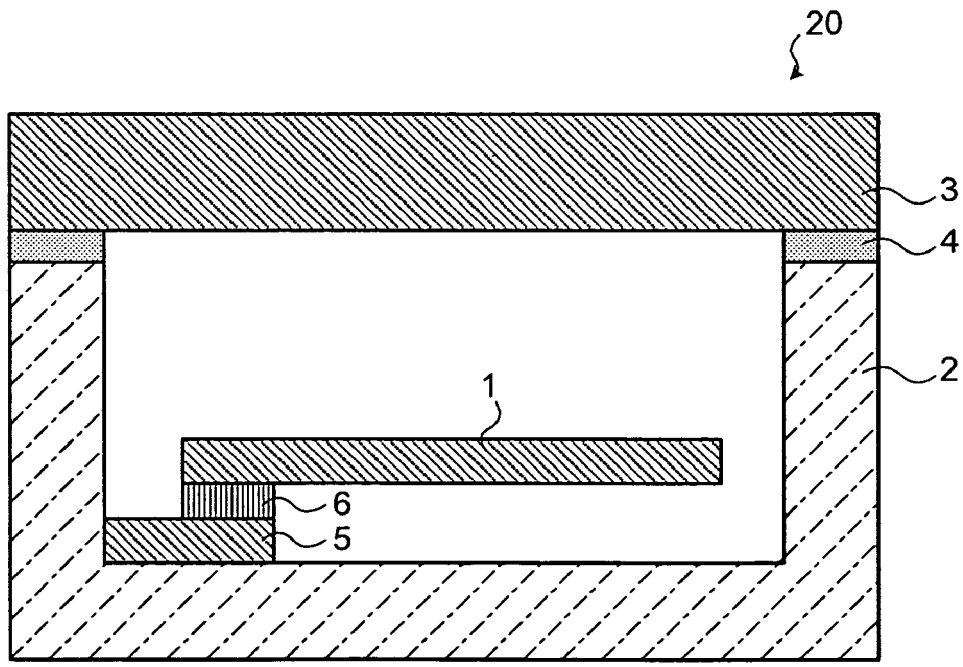
FIG. 2 is a schematic cross sectional view of the package manufactured by the manufacturing method of FIG. 1.
Figure 3:
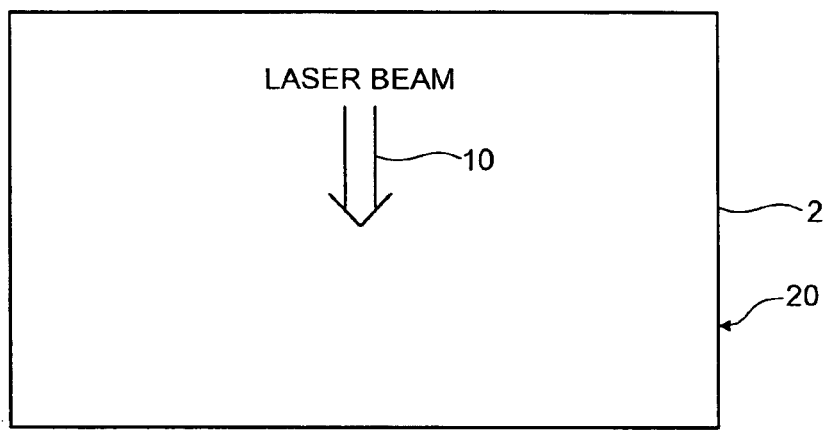
FIG. 3 is a schematic plan view for explaining a laser irradiation method in an annealing process of the manufacturing method of FIG. 1.
Figure 4:
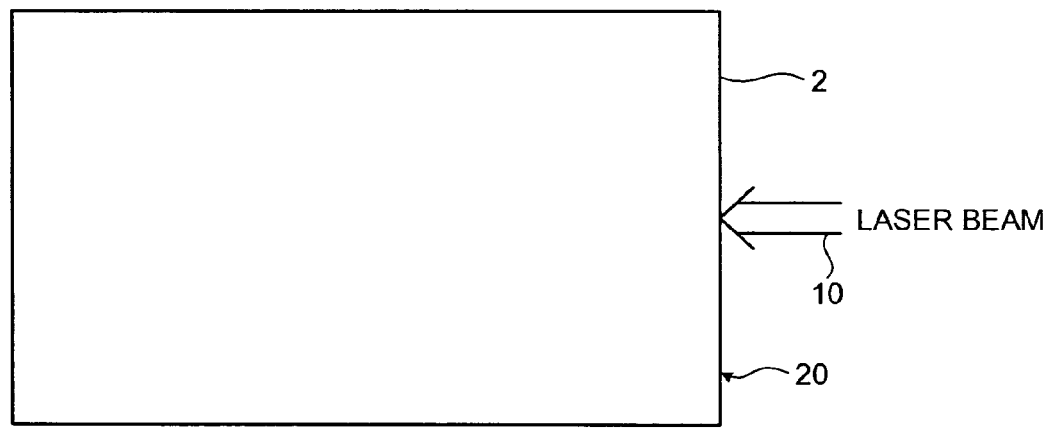
FIG. 4 is a schematic plan view for explaining another example of the laser irradiation method in the annealing process of the manufacturing method of FIG. 1.
Figure 5:
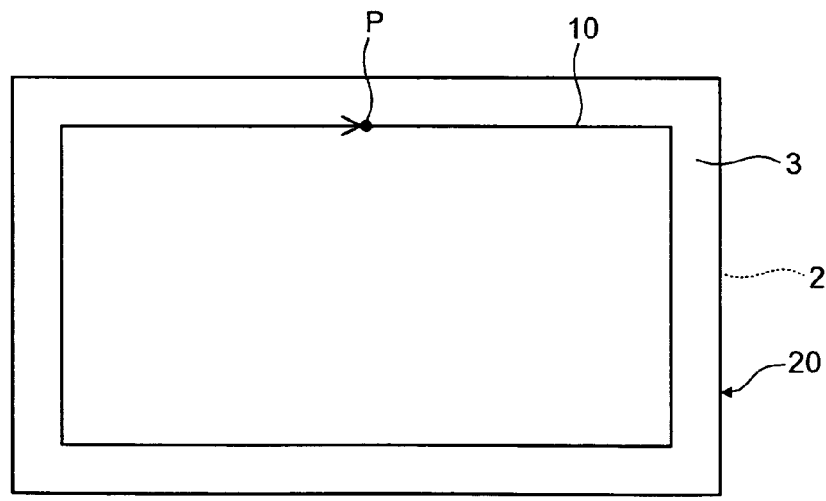
FIG. 5 is a schematic plan view for explaining the laser irradiation method in a welding process of the manufacturing method of FIG. 1.

FIG. 1 is a flow chart illustrating respective processes in the manufacturing method of a package according to a first embodiment of the present invention. FIG. 2 is a schematic cross sectional view of the package manufactured by the manufacturing method of FIG. 1. FIGS. 3 through 5 are schematic plan views for explaining the respective processes in the manufacturing method of FIG. 1. Specifically, FIGS. 3 and 4 illustrate a laser irradiation method in an annealing process of FIG. 1, while FIG. 5 illustrates a locus of the laser in a welding process of FIG. 1. While an electron beam, an ion beam, the laser (a solid state laser, a gas laser, and a semiconductor laser), and a microwave may be used as a beam, the electron beam and the semiconductor laser are particularly easy to use. In the present embodiment, there will be described the case where the laser is used.

As shown in FIG. 1, in the manufacturing method of the package of the present embodiment, a quartz oscillator 1 is firstly housed in a housing 2 of FIG. 2 (step S101). As shown in FIG. 2, the housing 2 includes a bottom wall and side walls that are arranged along the circumference of the bottom wall, and has a rectangular box shape with an upper part being opened. While a composition material of the housing 2 includes a ceramic, a metal, a resin, or the like, the housing 2 here is composed of the ceramic. Dimensions of the housing 2 here are 4.1 mm in length of a long side, 1.5 mm in length of a short side, and 0.7 mm in height. A support 5 is disposed on the bottom of the housing 2, and a piece of quartz, which is the quartz oscillator 1, is disposed in parallel with the bottom of the housing 2 on the support 5 via a bonding material 6. Thereby, the constitution is achieved where the quartz oscillator 1 is housed in the housing 2.

Here, as the quartz oscillator 1, a tuning fork type quartz oscillator having a U shape is used. In this case, it is arranged so that rising portions of the U shape are in parallel with the long sides of the housing 2.

After arranging and housing the quartz oscillator 1 in the housing 2 as described above, a lid 3 is arranged on an upper surface of the side walls of the housing 2 via a sealing material 4 so as to seal the opening of the housing 2. A roller electrode (not shown) of a resistance welder is then pressed onto the centers of the two short sides of the lid 3 from the lid 3 side, thereby tacking the lid 3 to the housing 2 by the resistance welding (tack welding) at two positions in the centers of the short sides (step S102 of FIG. 1). Here, the roller electrode of the resistance welder corresponds to an externally connected metal electrode. Note herein that, while the centers of the short sides of the lid 3 are tacked, portions other than these may be pressed to be tacked.

As shown in FIG. 2, the lid 3 has a shape whose circumference substantially corresponds with the circumference of the housing 2 when seen from the top. The lid 3 is composed of the metal, and is composed of an iron-based alloy (Kovar) here. The sealing material 4 disposed between the housing 2 and the lid 3 is composed of a brazing metal, and the brazing metal composed of such as a gold-tin alloy, a silver alloy, or an aluminum alloy is used here. The sealing material 4 is disposed preliminarily on the upper surface of the side walls of the housing 2.

Although not illustrated in FIG. 2, a metallized layer composed of tungsten is provided on the upper surface of the side walls of the housing 2, and nickel plating and gold plating are further provided on the metallized layer. The sealing material 4 is provided preliminarily on the gold plating. As described above, by disposing the sealing material 4 preliminarily on the upper surface of the side walls of the housing 2, the laser irradiation in a welding process (step S105 of FIG. 1), which will be described later, may only weld the lid 3 and the sealing material 4, wherein the lid 3 with excellent thermal conductivity is readily welded to the sealing material 4. Note herein that, the sealing material 4 may be disposed preliminarily on the lid 3 side.

After tacking the lid 3 to the housing 2 like this, a predetermined area of the housing 2 is irradiated with the laser. Thereby, a package 20 including the housing 2, the lid 3, or the like is dried by heating, so that a volatile component such as atmospheric impurities or moisture adhered to the lid 3, the housing 2, or the sealing material 4 is removed. Here, outgassing processing of a non-volatile component subjected to such heating is referred to as an annealing treatment (annealing process at step S103 of FIG. 1). While an irradiation area of the laser in the annealing process at step S103 is not limited particularly, reflection of the beam occurs by irradiating the laser to an externally connected metal electrode (not shown) provided on the lid 3 composed of the metal or the housing 2, resulting in the decrease in heating efficiency. As a result, in the package 20, it is preferred to irradiate the laser 10 to the area excluding the externally connected electrode of the lid 3 and the housing 2, specifically to a predetermined area of the housing 2 made of the ceramic.

For example, as shown in FIG. 3, the external surface of the bottom wall of the housing 2 may be irradiated with the laser 10 to be subjected to the annealing treatment. In this case, the laser 10 may be irradiated, in the shape of a spot, to a predetermined area on the external surface of the bottom wall of the housing 2, or may be scanned in the predetermined area on the external surface of the bottom wall. Such irradiation of the laser 10 may be performed in one time or intermittently in multiple times. Specifically, the laser 10 may be irradiated intermittently in multiple times to the identical area on the external surface of the bottom wall of the housing 2, or the laser 10 may be irradiated in one time or intermittently in multiple times to each of plural areas at different positions.

In addition, as shown in FIG. 4, the external surface of the side wall of the housing 2 may be irradiated with the laser 10 to be subjected to the annealing treatment. In this case, the laser 10 may be irradiated, in the shape of the spot, to a predetermined area on the external surface of the side wall of the housing 2, or may be scanned in the predetermined area on the external surface of the side wall. For example, on the external surface of one of the side walls of the housing 2, as with the above case for irradiating the bottom wall, the laser 10 may be irradiated, in one time or intermittently in multiple times, to the identical area, or the laser 10 may be irradiated, in one time or intermittently in multiple times, to each of plural different areas on the external surface of one of the side walls. Alternatively, on the surfaces of plural side walls of the housing 2, the laser 10 may be irradiated to the respective side walls.

Here, by irradiating the laser 10 intermittently in multiple times, the reduction in damage to the package 20 (specifically, the housing 2 to which the laser 10 is irradiated) is achieved. Moreover, by irradiating the laser 10 to each of the plural different areas, the improvement in the heating efficiency of package 20 is achieved.

An output value of the laser 10 may be the same as the output value of the laser 10 in the welding process step S105 of FIG. 1 (see FIG. 5), which will be described later, or may be lower than this. Here, the output value of the laser 10 is set lower than the output value of the laser 10 in the welding process at step S105. Specifically, the output value lower than the output value of the laser 10 in the welding process at step S105 is a beam output value with which the sealing material 4 hardly melts.

Furthermore, irradiation conditions of the laser 10 in the annealing process step S103 (see FIG. 1), for example, the beam irradiation time, the number of positions of the beam irradiation, or the distance of the beam scanning, are suitably set to the conditions under which the annealing process can be effectively performed, and, specifically, suitably set in accordance with the size of the package 20, the material of the housing 2, or the like.

Such annealing process at step S103 is performed using a conventional laser beam machining device, to irradiate the housing 2 with the laser 10 within a processing chamber maintained at a vacuum state. For example, in the laser beam machining device, by suitably moving a movable irradiation head of the laser 10, it becomes possible to irradiate a desired position of the housing 2 with the laser 10.

A gas derived from the volatile component generated in the annealing treatment is, by leaving the package 20 in the processing chamber for a predetermined time after the irradiation of the laser 10 illustrated in FIG. 3 or 4, discharged from the interior of the package 20 into the processing chamber (step S104 of FIG. 1). Here, since the interior of the processing chamber is maintained at the vacuum state, it becomes possible to perform the discharging efficiently. Thereby, it becomes possible to maintain the interior of the package 20 at the high-vacuum state.

Here, as shown in FIG. 2, between the housing 2 and the lid 3 disposed via the sealing material 4, a communicating section is formed which causes the interior space of the housing 2 in which the quartz oscillator 1 is housed (i.e., a housing portion) to communicate with the exterior of the housing 2 (specifically, inside of the processing chamber), except for a tack-welded section which is tacked at the step S102 of FIG. 1. Accordingly, it becomes possible to discharge the gas derived from the volatile component removed by the annealing treatment to the exterior of the package 20 (i.e., inside of the processing chamber) via this communicating section.

After discharging the gas at the step S104 of FIG. 1, as shown in FIG. 5, the laser 10 is then scanned sequentially in a predetermined direction from the lid 3 side of the package 20 along the rim to perform the beam irradiation, so that the package 20 is sealed completely (the welding process at step S105 of FIG. 1). Here, the entire rim of the lid 3 is scanned at one time so that a starting point and a terminal point of the beam irradiation coincide at a point P. By such an irradiation of the laser 10, the sealing material 4 of FIG. 2 is heated and melted, thereby the foregoing communicating section between the housing 2 and the lid 3 is welded to seal the package 20. Accordingly, the welding process step S105 corresponds to a communicating section beam welding process here. Note herein that, although the laser 10 is scanned in the clockwise direction in the welding process at step S105 here, the laser 10 may be scanned in the counterclockwise direction. In addition, the position of the point P used as the starting point and the terminal point of the beam irradiation may be other than the position of FIG. 5.

As described above, according to the manufacturing method of the package of the present embodiment, the annealing treatment in the annealing process at step S103 is performed using the same laser 10 in the welding process at step S105, so that it becomes possible to perform the respective treatments in the annealing process step S103, the gas discharging process at step S104, and the welding process at step S105 within the same processing chamber using the same laser beam machining device. Consequently, it is not necessary to provide a separate arrangement for the annealing treatment (for example, an anterior chamber or a posterior chamber of a sealing processing chamber, which is required conventionally), resulting in the reduction in the apparatus cost. Moreover, it becomes possible to perform the respective processes of steps S103 through S105 continuously within the same processing chamber, resulting in the need of such as conveyance of the package 20 between the processes being eliminated. Consequently, while the improvement in the manufacturing efficiency of the package 20 is achieved, it becomes possible to discharge the gas effectively.

Furthermore, in the annealing treatment using the laser 10, the local temperature of a portion irradiated with the beam and a neighboring area thereof increases rapidly and then, when the beam irradiation is stopped, the temperature of these areas decreases rapidly. Therefore, compared to the case where the annealing treatment is performed by heating the entire package 20 using a heating plate or a heating lamp in a conventional manner, the respective packages 20 can be heated to the high temperature efficiently and can be cooled efficiently, resulting in the need of providing a separate cooling process being eliminated. Consequently, from this point as well, the improvement in the manufacturing efficiency of the package 20 is achieved.

Meanwhile, upon manufacturing the package 20 in general, a series of manufacturing processes is performed in a single batch to manufacture the package 20 and each of the processes is performed to the plural packages 20 in a single batch, so that the plural packages 20 are manufactured simultaneously. Specifically, the plural packages 20 here are arranged in plural columns and plural rows at a predetermined interval within the processing chamber of the laser beam machining device. And, in the annealing process at step S103, the respective packages 20 are irradiated with the laser beam 10 illustrated in FIG. 3 or 4 sequentially to be subjected to the annealing treatment, and then, in the welding process at step S105, the respective packages 20 are irradiated with the laser beam 10 illustrated in FIG. 5 sequentially to perform the sealing of the packages 20.

In the annealing process at step S103 where each of the plural packages 20 is irradiated sequentially with the beam, the package 20, which has been heated and annealed by the beam irradiation discharges the gas and has been then cooled while treating another package 20. Accordingly, without providing the separate gas discharging process at step S104, it becomes possible to automatically discharge the gas efficiently. In addition, without providing the separate cooling step, it becomes possible to automatically perform the cooling efficiently.

Note herein that, although the case where the laser 10 is irradiated to perform the respective processes in the annealing process at step S103 and the welding process at step S105 is described above, the respective processes in these process steps S103 and S105 may be performed by irradiating the electron beam instead of the laser 10. For example, when the annealing treatment is subjected thereto using the electron beam, it is not reflected by the metal like the case of the laser 10, so that it may be irradiated to either the lid 3 or the housing 2. However, since the housing 2 is damaged by the generated heat when the housing 2 is irradiated with the electron beam, it is sufficient to decrease the output value suitably in consideration thereof.

Here, when using the electron beam in the annealing process at step S103, the damage given by the electron beam to the package 20 is greater than the case where the laser 10 is used, so that, in consideration of the influence on the package 20, the beam irradiation is performed with the suitable output. In addition, when the electron beam is irradiated in the shape of a spot to a predetermined area of the housing 2 for example, it increases the damage given to the area. Consequently, when using the electron beam, it is preferred to scan the beam to perform the beam irradiation. Moreover, when the electron beam is scanned to perform the beam irradiation, an irradiation locus of the electron beam affects such as the appearance of the package, and thus it is preferred to scan so that the locus of the laser 10 irradiated in the welding process S105 and the locus of the electron beam coincide.

Second Embodiment

Figure 6:
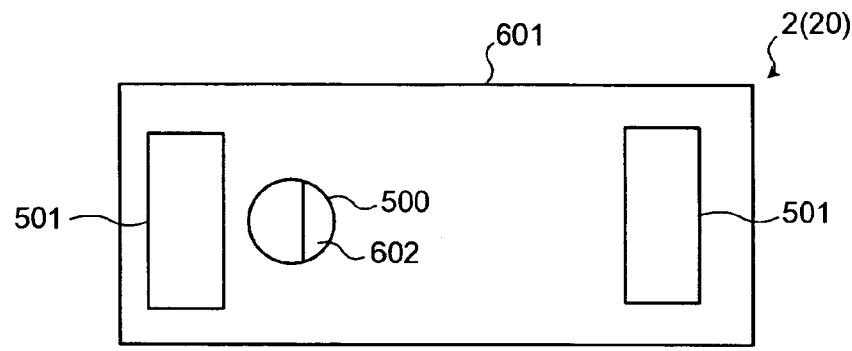
FIG. 6 is a bottom plan view of a housing used in the manufacturing method of the package according to a second embodiment of the present invention.
Figure 7:
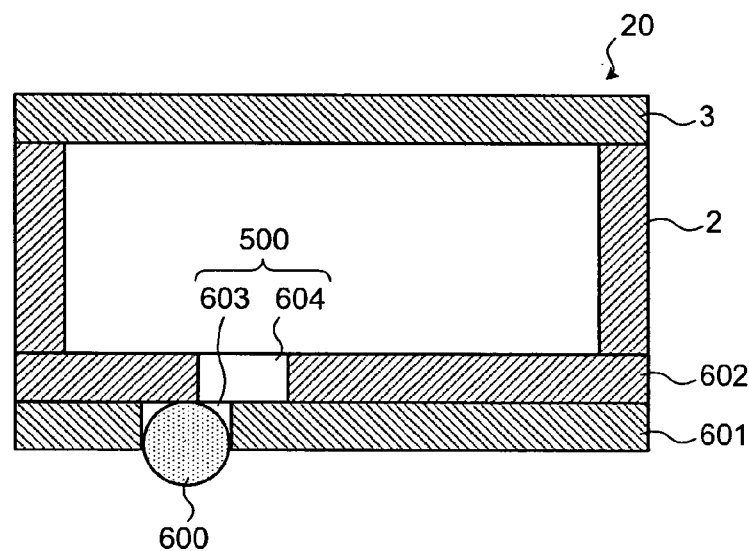
FIG. 7 is a schematic cross sectional view for explaining the welding process of the manufacturing method of the package according to the second embodiment of the present invention.
Figure 8:
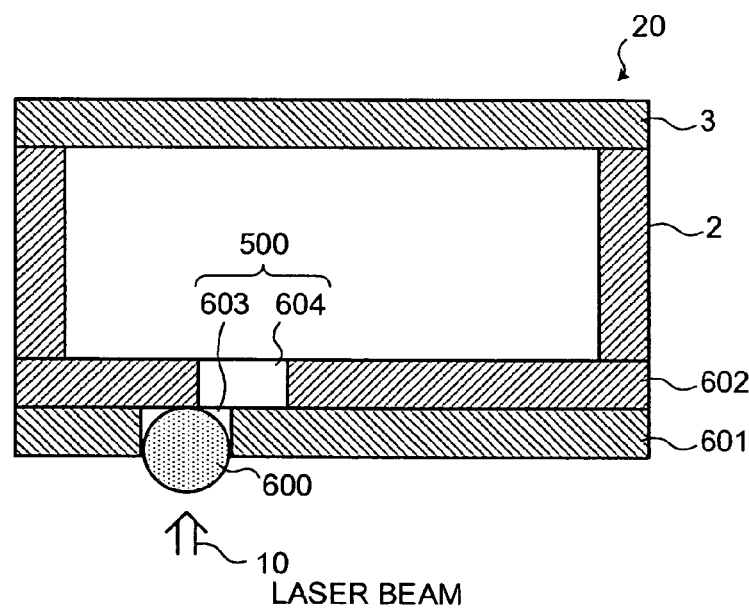
FIG. 8 is a schematic cross sectional view for explaining the welding process of the manufacturing method of the package according to the second embodiment of the present invention.
Figure 9:
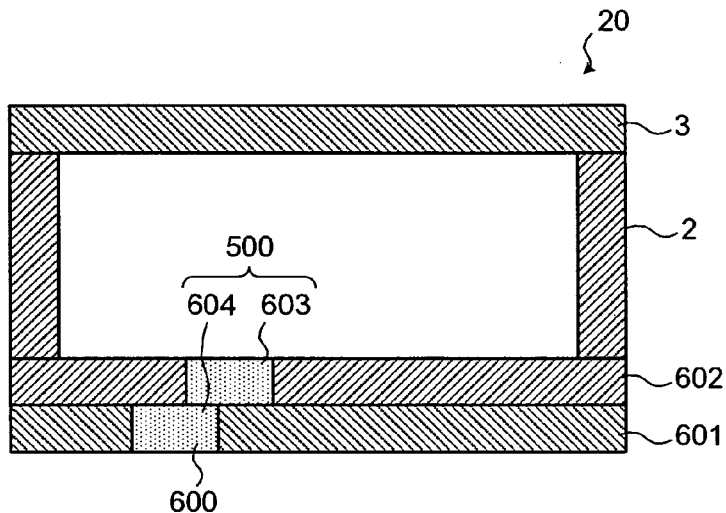
FIG. 9 is a schematic cross sectional view for explaining the welding process of the manufacturing method of the package according to the second embodiment of the present invention.

FIGS. 6 through 9 are figures for explaining the manufacturing method of the package according to a second embodiment of the present invention. Specifically, FIG. 6 is a plan view of the housing used for the package of the present embodiment seen from the bottom, while FIGS. 7 through 9 are schematic cross sectional views illustrating the welding process of the manufacturing method according to the present embodiment.

Although the manufacturing method of the package according to the present embodiment includes the respective process steps S101 through S105 illustrated in the flowchart of FIG. 1, as with the case of the first embodiment, to manufacture the package 20 of FIG. 2, the followings are different from the first embodiment.

As shown in FIG. 6, in the package 20 of the present embodiment, the bottom of the housing 2 is provided with a through hole 500 to cause the interior of the package 20 (i.e., the housing portion of the housing 2 for the quartz oscillator 1) to communicate with the exterior of the package 20. Accordingly, the through hole 500 corresponds to a communicating section here.

As shown in FIG. 7, the bottom of the housing 2 is constituted by laminating two bottom plates 601 and 602, and the first bottom plate 601 arranged outside and the second bottom plate 602 arranged inside are provided with circular through holes 603 and 604, respectively.

The through hole 603 of the first bottom plate 601 and the through hole 604 of the second bottom plate 602 are arranged so that, when the first and second bottom plates 601 and 602 are laminated to form the bottom surface of the housing 2, the holes overlap partially when seen from the top, thereby the two through holes 603 and 604 are combined to form the through hole 500. With this through hole 500, the first and second bottom plates 601 and 602 project respectively in a portion within the hole where the through holes 603 and 604 do not overlap, thereby the through hole 500 with a stepwise shape therein is formed.

Next, the manufacturing method of the package of the present embodiment will be explained. First, in the present embodiment, steps S101 and S102 of FIG. 1 are performed as with the case of the first embodiment. Then, the package 20 is arranged in the laser beam machining device and, in the processing chamber maintained at the vacuum state, the laser 10 is irradiated from the lid 3 side of the package 20 as shown in FIG. 5 so that the laser 10 is scanned over the entire rim of the lid 3 with the point P as the starting point and the terminal point. Thereby, the sealing material 4 (see FIG. 2) is melted over the entire rim of the lid 3, so that the lid 3 and the housing 2 are welded completely. Although the lid 3 and the housing 2 are welded by the laser 10 here, the welding method is not limited to the laser irradiation, and the welding may be performed, for example, by heating the lid 3 and the housing 2 with such as a heating furnace or a halogen lamp or may be performed by irradiating the electron beam which is easy to scan.

Although, in such welding of the housing 2 and the lid 3, there is generated such as the gas derived from the volatile component of the sealing material 4 or the volatile component adhered to the package 20 for example, the gas is discharged here from the interior of the package 20 to the outside (here, inside of the processing chamber at the vacuum state) via the through hole 500 disposed in the bottom of the housing 2.

After welding the housing 2 and the lid 3 as described above, the annealing treatment is performed in the annealing process at step S103 of FIG. 1 according to the method described above in the first embodiment. Thereby, the volatile components adhered to the package 20 are volatilized as described above to generate the gas. Here, by leaving the package 20 within the processing chamber for a predetermined time, the gas derived from the volatile component is discharged from the interior of the package 20 to the outside (i.e., inside of the processing chamber) via the through hole 500 within the processing chamber (step S104 of FIG. 1).

Here, in the annealing process at step S103, when the external surface of the bottom wall of the housing 2 is irradiated with the laser 10 as shown in FIG. 3, the laser 10 is irradiated to the area except for the formation area of the through hole 500 and the externally connected electrode 501.

Thereafter, as shown in FIG. 7, a through hole sealing material 600 is charged (disposed) within the through hole 500 in order to close the through hole 500 in the bottom of the housing 2. Here, the through hole sealing material 600 having a substantially spherical shape is arranged in the through hole 603 of the first bottom plate 601 so as to contact with the surface of the second bottom plate 602. The process for performing such an arrangement of the through hole sealing material 600 is referred to as a through hole sealing material charging process. This through hole sealing material charging process is performed within the processing chamber of the laser beam machining device maintained at the vacuum state.

Note herein that, although the case is illustrated above where the through hole sealing material charging process is performed after the annealing process at step S103 of FIG. 1, the through hole sealing material charging process may be performed before the annealing process at step S103. In this case, although the above-described gas generated in the annealing process at step S103 is discharged outside via the through hole 500 charged with the through hole sealing material 600, a gap is formed between the through hole sealing material 600 and the through hole 500, so that it becomes possible to discharge the gas via the gap.

After the above-described through hole sealing material charging process, the beam welding of the through hole 500 is performed to seal the package 20 of FIG. 2 completely (the welding process at step S105 of FIG. 1). Specifically, as shown in FIG. 8, the through hole sealing material 600 charged in the through hole 500 is selectively irradiated with the laser 10 to melt the through hole sealing material 600. Thereby, as shown in FIG. 9, the melted through hole sealing material 600 is filled in the through hole 500 to close the through hole 500, so that the complete sealing of the package 20 is achieved.

As described above, in the present embodiment, the welding process at step S105 of the through hole 500 corresponds to the communicating section beam welding process. In the manufacturing method of the package of the present embodiment with this configuration, while the annealing treatment is performed by irradiating the laser 10 illustrated in FIG. 3 or 4, as with the first embodiment, the gas derived from the volatile component generated in the annealing treatment is discharged via the through hole 500. Consequently, the effect similar to that described above in the first embodiment 1 is acquired.

Note herein that, there is described above the case where the welding of the housing 2 and the lid 3 illustrated in FIG. 5 and the beam welding of the through hole 500 illustrated in FIG. 8 are performed using the laser 10, the electron beam may be used instead of the laser 10 to perform these welding processes.

Third Embodiment

Figure 10:
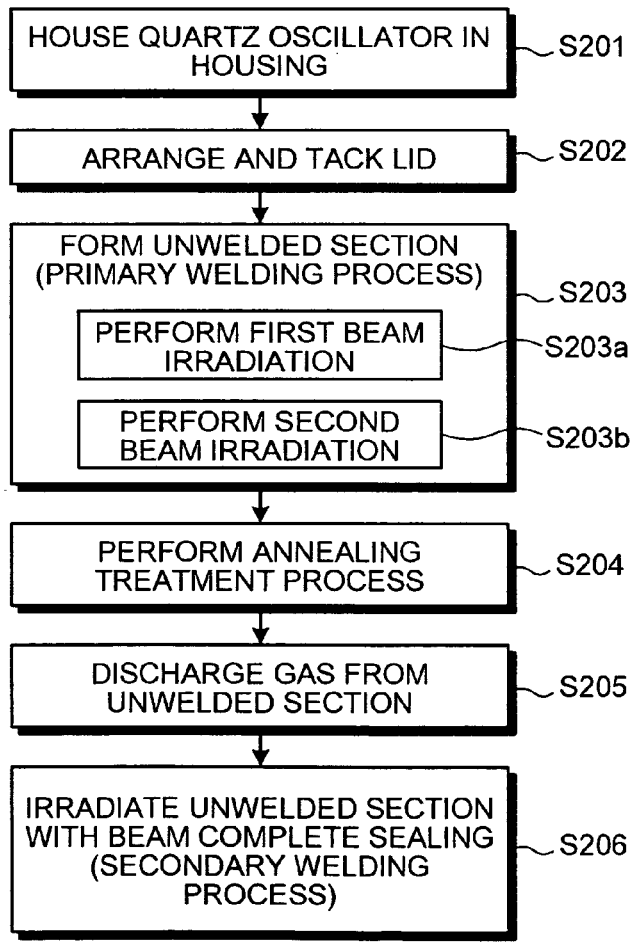
FIG. 10 is a flowchart illustrating the respective processes in the manufacturing method of the package according to a third embodiment of the present invention.
Figure 11:
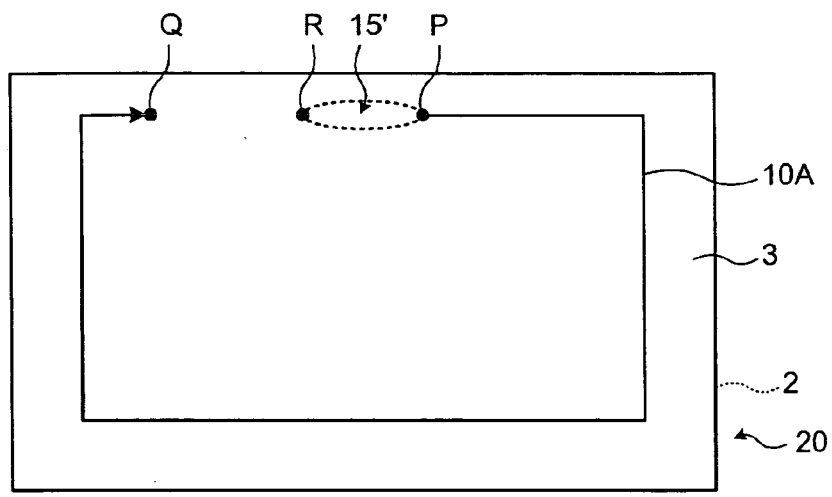
FIG. 11 is a schematic plan view for explaining an electron beam irradiation method in a primary welding process of the manufacturing method of FIG. 10.
Figure 12:
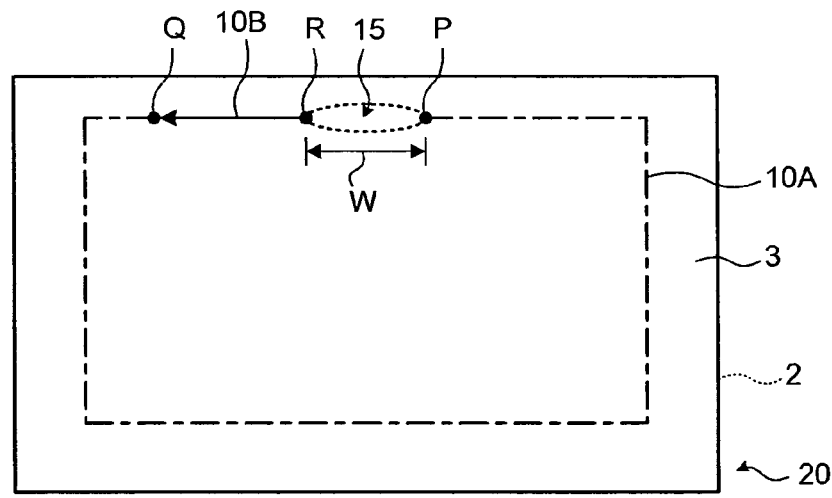
FIG. 12 is a schematic plan view for explaining the electron beam irradiation method in the primary welding process of the manufacturing method of FIG. 10.
Figure 13:
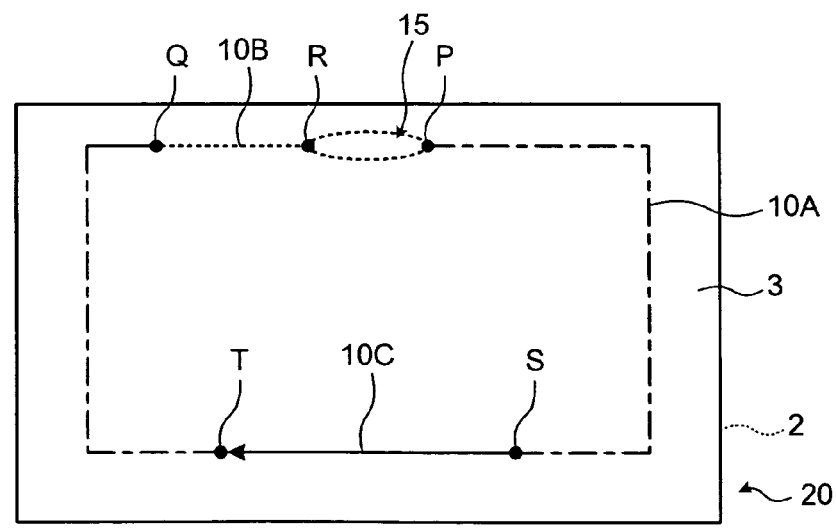
FIG. 13 is a schematic plan view for explaining the electron beam irradiation method in the annealing process of the manufacturing method of FIG. 10.
Figure 14:
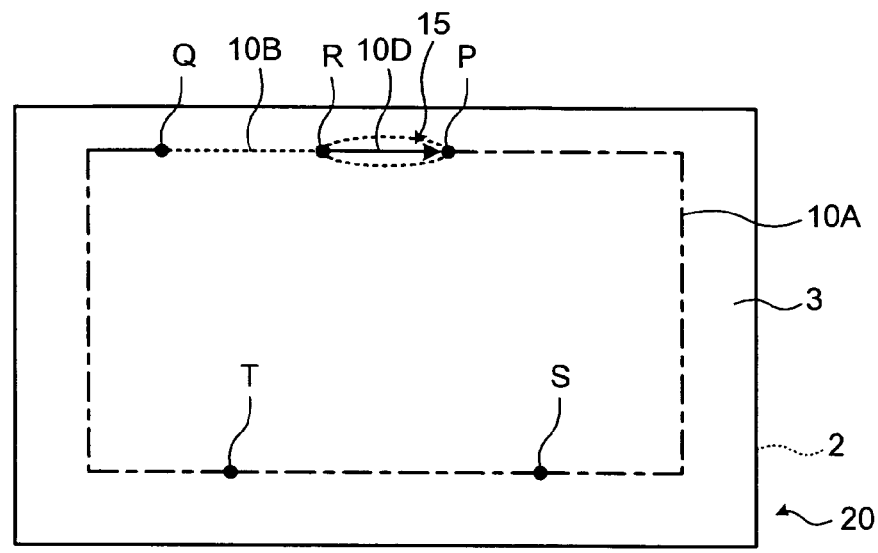
FIG. 14 is a schematic plan view for explaining the electron beam irradiation method in a secondary welding process of the manufacturing method of FIG. 10.

FIG. 10 is a flowchart illustrating the respective processes in the manufacturing method of the package according to a third embodiment of the present invention. FIGS. 11 through 14 are schematic plan views for explaining the electron beam irradiation method in the respective processes of the manufacturing method of FIG. 10, illustrating the locus of the electron beam irradiated to the package from the lid side. Specifically, FIGS. 11 and 12 illustrate the locus of the electron beam in a primary welding process at step S203 of FIG. 10, FIG. 13 illustrates the locus of the electron beam in an annealing process at step S204 of FIG. 10, and FIG. 14 illustrates the locus of the electron beam in a secondary welding process at step S206 of FIG. 10.

In the package manufacturing method of the present embodiment, as shown in FIG. 10, the quartz oscillator 1 is firstly housed in the housing 2 of FIG. 2 (step S201). Then, by the method described above in step S102 of FIG. 1 of the first embodiment, the lid 3 and the housing 2 are tacked (step S202). After tacking the lid 3 to the housing 2, as shown in FIGS. 11 through 14, electron beams 10A, 10B, 10C, and 10D are scanned in a predetermined direction from the lid 3 side to along the rim of the lid 3 to perform the beam irradiation, so as to melt the sealing material 4 in the irradiated portion. Thereby, the lid 3 is affixed to the housing 2 so that the package 20 is sealed.

As shown in FIGS. 10 through 14, the sealing process of the package 20 includes: a primary welding process at step S203 to seal an area other than a predetermined area which is not irradiated with the electron beam 10A and 10B and left as an unwelded section 15; an annealing process at step S204 to subject to the annealing treatment by irradiating the electron beam 10C to a predetermined area on the locus of the electron beam 10A so as to trace the locus; a process at step S205 to discharge the gas generated in the primary welding process or derived from the volatile component generated by the annealing treatment through the formed unwelded section 15; and a secondary welding process at step S206 to seal the package 20 completely by irradiating the electron beam 10D while scanning the unwelded section 15. The primary welding process at step S203 is further divided into a first beam irradiation process at step S203*a* and a second beam irradiation process at step S203*b* whose irradiation patterns (irradiation trajectories) are different from each other.

Meanwhile, the electron beam irradiation in the present embodiment is performed using a common electron beam machining device. Although a detailed explanation of the electron beam machining device is omitted here, the electron beam machining device is provided with at least an electron gun for generating the electron beam, the processing chamber having a processing object (corresponds to the package 20 of FIG. 2 here) disposed therein and the electron beam is irradiated to the processing object to perform the welding, and a deflector to control the course of the electron beam.

The electron beam generated with the electron gun is deflected by the deflector and is introduced into the processing chamber, and then the course thereof is controlled by the deflector so as to irradiate to the package 20 of FIG. 11 as the processing object while drawing a desired beam locus from the lid 3 side along its rim. In the processing by such an electron beam machining device, the interior of the device is maintained at the vacuum state. In addition, the deflector is to deflect the electron beam by means of a magnetic field, constituted by such as a coil for example.

Upon sealing the package 20, as shown in FIGS. 11 and 12, the primary welding process at step S203 (see FIG. 10) is performed first for forming the unwelded section 15. Width W of the unwelded section 15 is designed preliminarily, so that the gas generated upon welding is discharged efficiently and the interior of the package 20 can be maintained at the high-vacuum state. Here, the unwelded section 15 with a predetermined width W is formed in the area between the points P and R (hereinafter, an unwelded section formation area 15') by the first and second beam irradiation process steps S203*a* and S203*b* (see FIG. 10).

Specifically, as shown in FIG. 11, the electron beam 10A is firstly irradiated to the package 20 from the point P, which is one end of the unwelded section formation area 15' (i.e., the point to be one end of the unwelded section 15), as the starting point to a point Q from the lid 3 side along the rim of the lid 3 having a rectangular shape in the clockwise direction. Here, such irradiation of the electron beam 10A from the point P to the point Q in the clockwise direction is referred to as the first beam irradiation process at step S203*a* (see FIG. 10). In the first beam irradiation process at step S203*a*, the point P as the starting point of the beam irradiation is set near the center of one of a pair of the long sides of the lid 3, and the electron beam 10A is scanned sequentially along the rim of the lid 3 from the point P, one of the short sides, the other long side, and to the other short side. The point Q as the terminal point of the beam irradiation is set as well on the same side as the point P, and the electron beam 10A is scanned to this point Q to perform the beam irradiation. Here, the point Q is, as shown in FIG. 12, located in the upper stream in the scanning direction of the electron beam 10A than the point R which is the other end of the unwelded section formation area 15' (i.e., the point to be the other end of the unwelded section 15).

As described above with regard to the conventional art, when stopping the irradiation of the electron beam 10A at the point Q, a termination processing, such as the increase in the speed of the beam irradiation speed, is performed. In such a stopping operation, under the influence of such as a small amount of the beam irradiation or afterheat in the termination processing, in an area in which the sealing material 4 is not intended to melt, specifically in the area in the unwelded section formation area 15' closer to the point R than the point Q, the sealing material 4 is melted leading to the welding being performed. However, since the point Q as the terminal point of the electron beam 10A is set in the area other than the unwelded section formation area 15', the influence of the irradiation of the electron beam 10A being stopped does not affect the unwelded section formation area 15'.

Next, as shown in FIG. 12, the electron beam 10B is irradiated to the package 20 from the point R, which is the other end of the unwelded section formation area 15' (i.e., the point to be the other end of the unwelded section 15) as the starting point from the lid 3 side. The electron beam 10B is scanned sequentially toward the point Q, which is the terminal point of the above-described first beam irradiation process at step S203*a*, along the rim of the lid 3 in the direction opposed to the beam scanning direction of the first beam irradiation process at step S203*a*, i.e., in the counterclockwise direction. Here, such an irradiation of the electron beam 10B in the counterclockwise direction from the point R to the point Q is referred to as the second beam irradiation process at step S203*b* (see FIG. 10).

Note herein that, although the terminal point of the second beam irradiation process at step S203*b* is set as the point Q here, a predetermined point beyond the point Q and in the lower stream in the beam scanning direction than the point Q (i.e., the point closer to the point P) may be set as the terminal point.

In addition, although, in the second beam irradiation process at step S203*b*, the electron beam is scanned in the direction opposed to the beam scanning direction in the first beam irradiation process at step S203*a* as described above, such a control of the scanning direction of the electron beam can be easily achieved by the deflector of the above-described electron beam machining device.

Upon stopping the irradiation of the electron beam 10B at the point Q as well, the termination processing is performed similarly to the first beam irradiation process at step S203*a*. Accordingly, in the stopping operation of the electron beam 10B, under the influence of such as a small amount of the beam irradiation or afterheat in the termination processing, in an area in which the sealing material 4 is not intended to melt, specifically in the area closer to the point P than the point Q, the sealing material 4 is melted leading to the welding being performed. However, since the point Q as the terminal point of the electron beam 10B is set in the area other than the unwelded section formation area 151, the influence of the irradiation of the electron beam 10B being stopped does not affect the unwelded section formation area 15'.

With the above-described first and second beam irradiation process steps S203a and S203b, the sealing material 4 in the area irradiated with the electron beams 10A and 10B melts, and thereby the lid 3 and the housing 2 are welded and affixed to each other by the sealing material 4. Meanwhile, the unwelded section 15 with a predetermined width W is formed in the unwelded section formation area 15' which is not irradiated with the electron beams 10A and 10B, i.e., the area between the points P and R. Here, the unwelded section 15 corresponds to the communicating section which causes the interior space of the housing 2 in which the quartz oscillator 1 (see FIG. 2) is housed (i.e., the housing portion) to communicate with the exterior of the housing 20 (specifically, inside of the processing chamber).

Figure 29:
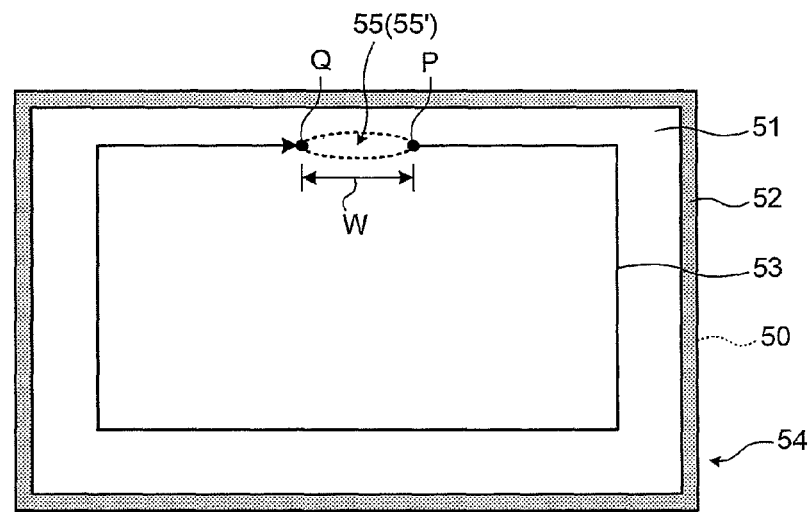
FIG. 29 is a schematic plan view illustrating another example of the conventional manufacturing method of the package.
Figure 30:
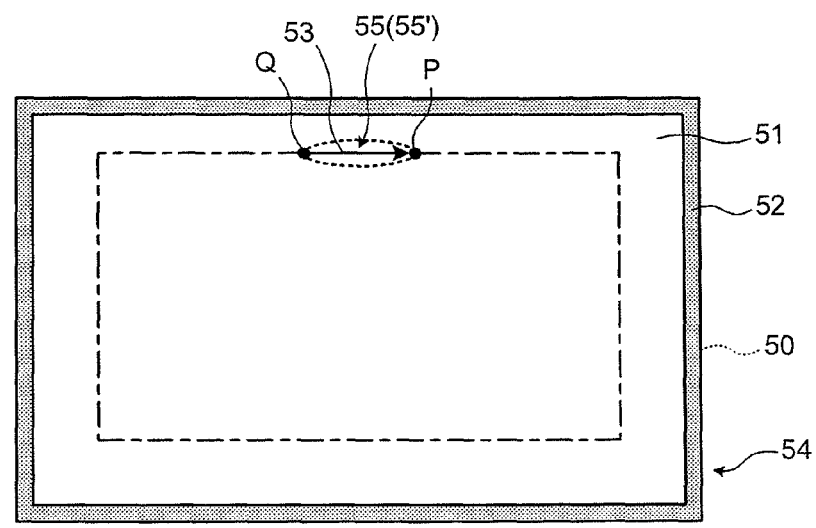
FIG. 30 is a schematic plan view illustrating another example of the conventional manufacturing method of the package.

As described above, when the electron beam is scanned from the point P to the point R in the clockwise direction by the conventional method illustrated in FIGS. 29 and 30 to form the unwelded section 15, it is difficult to cause the terminal point of the beam to coincide with the point R as one end of the unwelded section 15, leading to the difficulty in forming the unwelded section 15 with the width W as designed.

On the contrary, since, in the present embodiment, the point R which corresponds to one end of the unwelded section 15 is constituted by the starting point of the second beam irradiation process at step S203b and thus the point R does not turn into the terminal point of either of the first and second beam irradiation process steps S203a and S203b, it becomes possible to coincide one end of the unwelded section 15 with point R precisely and easily. In other words, the unwelded section 15 is characterized by being formed between the starting points of scanning in the irradiation of two types of beams 10A and 10B having different processing patterns with the both starting points P and R as both ends.

Moreover, although the sealing material 4 is melted in a portion beyond the point Q, which is the terminal point of the first beam irradiation process at step S203a, the point Q and a neighboring portion thereof do not participate in the formation of the unwelded section 15, so that it is not necessary here to control the position of the terminal point precisely.

Consequently, according to the method of the present embodiment, it becomes possible to form the unwelded section 15 between the points P and R precisely and easily as designed. As a result, the formation limit of the width W of the unwelded section 15, which has been approximately 0.5 mm conventionally, is improved to approximately 0.2 mm. In fact, in consideration of the yield of the package 20, the unwelded section 15 with the width W of 0.5 mm can be formed constantly.

After forming the unwelded section 15 as described above, as shown in FIG. 13, the electron beam 10C is irradiated to a predetermined area of the irradiation section of the electron beam 10A (in other words, on the locus of the electron beam 10A) so as to trace the locus of the electron beam 10A. By such an irradiation of the electron beam 10C, the package 20 is dried by heating so that the annealing treatment is performed (the annealing process at step S204 of FIG. 10). Specifically, the electron beam 10C is irradiated to the package 20 from the lid 3 side to scan the locus of the electron beam 10A from a point S as the starting point on the locus of the electron beam 10A on the long side, in which the unwelded section 15 is not formed, to a point T as the terminal point on the locus of the electron beam 10A. Accordingly, the locus of the electron beam 10C coincides with the beam locus of the electron beam 10A.

The output value of the electron beam 10C may be the same as the output values of the electron beams 10A and 10B in the primary welding process at step S203 of FIG. 10, or may be lower than them. Here, the output value of the electron beam 10C is set lower than the output values of the electron beams 10A and 10B, and the scanning is performed in multiple times. The output value that is lower than the output values of the electron beams 10A and 10B is the beam output value with which the sealing material 4 hardly melts.

Note herein that, although the case is illustrated above where the annealing process at step S204 is performed after the primary welding process at step S203 of FIG. 10, the annealing process at step S204 may be performed before the primary welding process at step S203.

In addition, the scanning distance of the electron beam 10C (specifically, the distance between the points S and T) is suitably set to the distance which can perform the annealing treatment by irradiating the electron beam 10C effectively, and, specifically, the scanning distance of the electron beam 10C is suitably set in accordance with the size of the package 20, the material of the housing 2, or the like.

By irradiating the electron beam 10C, the package 20 is dried by heating in the processing chamber at the vacuum state of the electron beam machining device, and particularly the entire housing 2 is heated in a short time. With the heated package 20, the gas generated by welding in the above-described primary welding process at step S203 is discharged from the interior of the package 20 to the outside via the opening (i.e., the communicating section) formed in the unwelded section 15, while the gas generated from the volatile component adhered to such as the housing 2 or the lid 3 being volatilized by the annealing treatment is discharged from the interior of the package 20 to the outside via the opening (i.e., the communicating section) formed in the unwelded section 15 (step S205 of FIG. 10).

In this case, since the interior of the package 20 communicates with the processing chamber of the electron beam machining device via the unwelded section 15 as the unsealed opening, and, particularly, the processing chamber is at the vacuum state here, the discharge of the gas from the interior of the package 20 into the processing chamber is facilitated, so that the discharge of the gas is performed efficiently. Accordingly, it becomes possible to maintain the interior of the package 20 at the high-vacuum state. In this case, by leaving the package 20 in the processing chamber for a predetermined time after the annealing process at step S204, the discharge of the gas is automatically facilitated.

After discharging the gas (step S205 of FIG. 10) as described above, as shown in FIG. 14, the unwelded section 15 is scanned and irradiated with the electron beam 10D to melt the sealing material 4 in the unwelded section 15, so as to seal the package 20 completely. Here, such a process which seals the unwelded section 15 is referred to as the secondary welding process at step S206 (see FIG. 10), and the secondary welding process at step S206 corresponds to the communicating section beam welding process.

In the secondary welding process at step S206 of FIG. 10, as shown in FIG. 14, the electron beam 10D is scanned from the point R as one end of the unwelded section 15 toward the point P as the other end to perform the beam irradiation. Thereby, the unwelded section 15 is welded so that the package 20 is sealed. In fact, since the distance between the points P and R is approximately 0.5 mm, it is also possible to irradiate the laser instead of the electron beam 10D in the shape of a spot to perform the welding.

In such secondary welding process at step S206, the welding area is narrower than that in the primary welding process at step S203 of FIG. 10, resulting in the reduction in the generation amount of the gas associated with the welding. Accordingly, the gas confinement within the finished package 20 is constrained, enabling to maintain the interior of the package 20 at the good vacuum state with a degree of vacuum of 13 Pa or below.

By performing such respective processes, with the package manufacturing method of the present embodiment, the package 20 with which the quartz oscillator 1 is housed within the housing at the high-vacuum state sealed with the lid 3 via the sealing material 4, as shown in FIG. 2, is manufactured.

Meanwhile, as described above in the first embodiment, upon manufacturing the package 20 in general, a series of manufacturing processes is performed in a single batch to manufacture the package 20 and each of the processes is performed to the plural packages 20 in a single batch, so that the plural packages 20 are manufactured simultaneously. Hereinafter, the manufacturing method of the plural packages 20 simultaneously by applying the above-described manufacturing method of the package will be illustrated.

Note that there is described hereinafter from the primary welding process at step S203 to the secondary welding process at step S206 of FIG. 10, and the other processes are assumed to be processed by a method similar to that as has been performed conventionally.

FIGS. 15 through 18 are schematic plan views which illustrate the manufacturing method of the plural packages 20 simultaneously by applying the above-described manufacturing method, illustrating a plan view of the interior of a processing chamber 21 of the electron beam machining device. Here, the plural packages 20 are arranged in plural columns and plural rows at a predetermined interval within the processing chamber 21.

Figure 15:
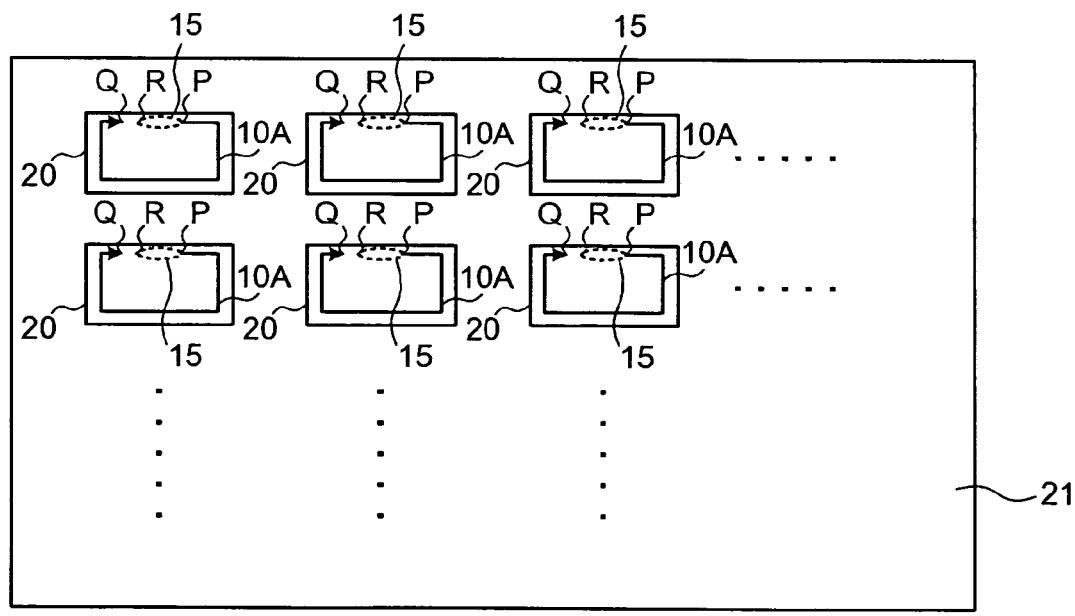
FIG. 15 is a schematic plan view illustrating the method of manufacturing plural packages simultaneously by applying the manufacturing method of FIG. 10.

As shown in FIG. 15, in the respective packages 20 arranged in the processing chamber 21, the first beam irradiation process at step S203a (see FIG. 10) illustrated in FIG. 11 is performed first. In this case, for example, the electron beam 10A is irradiated sequentially to the adjacent packages 20 for one column respectively, and, after one column is completed, the electron beam 10A is irradiated further to the adjacent column in a similar manner. Alternatively, the electron beam 10A is irradiated sequentially to the adjacent packages 20 for one row respectively, and, after one row is completed, the electron beam 10A is irradiated further to the adjacent row in a similar manner. The course of the electron beam 10A is suitably controlled by the deflector (not shown) easily.

Figure 16:
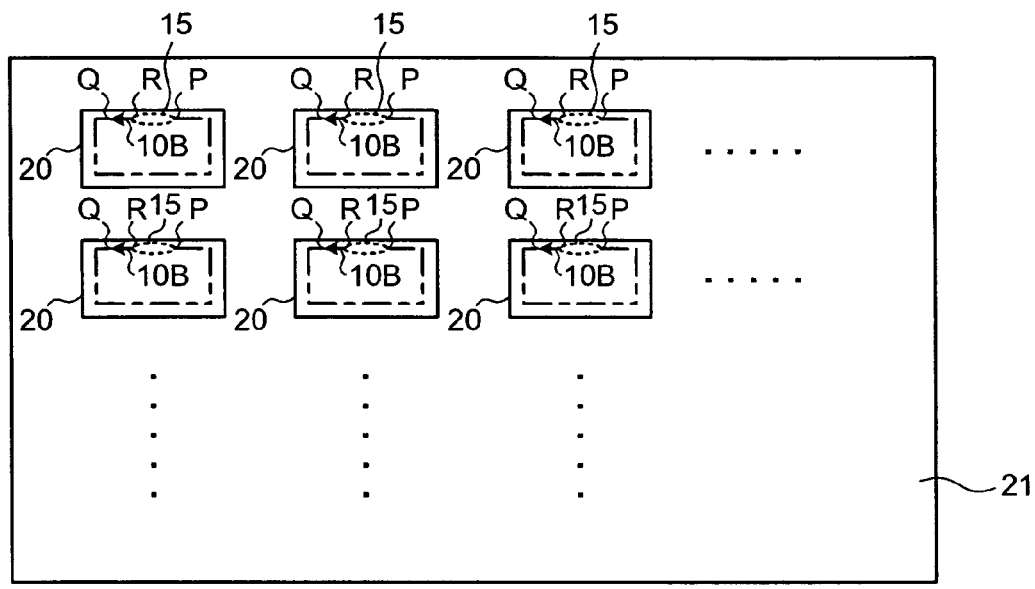
FIG. 16 is a schematic plan view illustrating the method of manufacturing the plural packages simultaneously by applying the manufacturing method of FIG. 10.

Next, as shown in FIG. 16, the second beam irradiation process at step S203b (see FIG. 10) illustrated in FIG. 12 is performed. In this case as well, similarly to the first beam irradiation process at step S203a (see FIG. 10) of above, the electron beam 10B is irradiated sequentially to the plural adjacent packages 20 arranged in the same column or in the same row respectively, and, after one column or one row is completed, the electron beam 10B is irradiated further to the adjacent column or row in a similar manner. Thereby, it becomes possible to form the unwelded section 15 in each of the plural packages 20.

Here, in the second beam irradiation process at step S203b such as described above, after irradiating the electron beam 10B to one package 20 to form the unwelded section 15 and then the electron beam 10B is irradiated to the other packages 20 sequentially to form the unwelded section 15, so that, in the package 20 in which the unwelded section 15 is formed, it becomes possible to discharge the gas from the unwelded section 15 while the electron beam 10B is irradiated to the other packages 20. Consequently, the discharge efficiency of the gas is improved.

Figure 17:
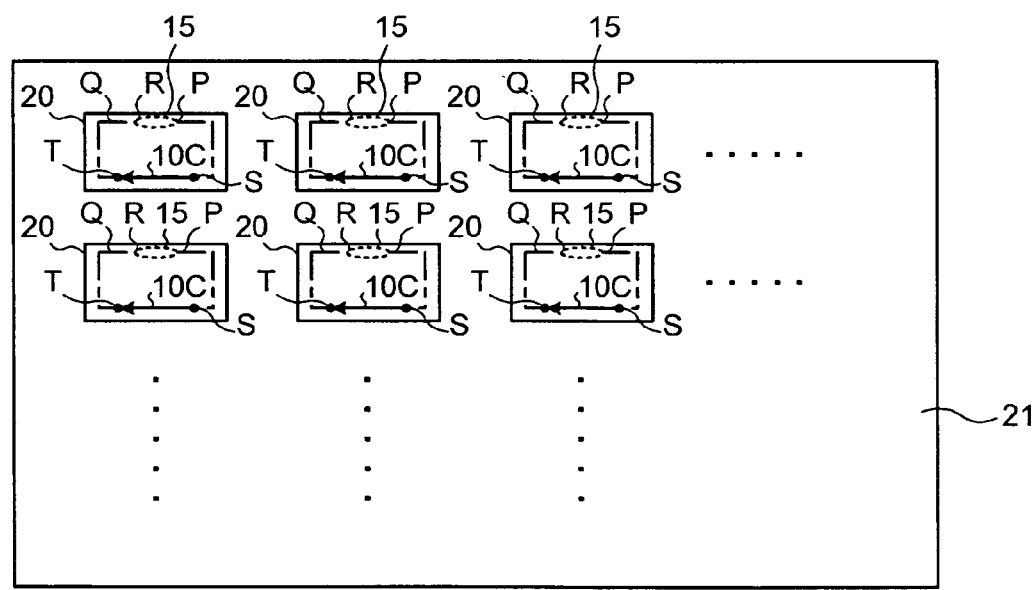
FIG. 17 is a schematic plan view illustrating the method of manufacturing the plural packages simultaneously by applying the manufacturing method of FIG. 10.
Figure 18:
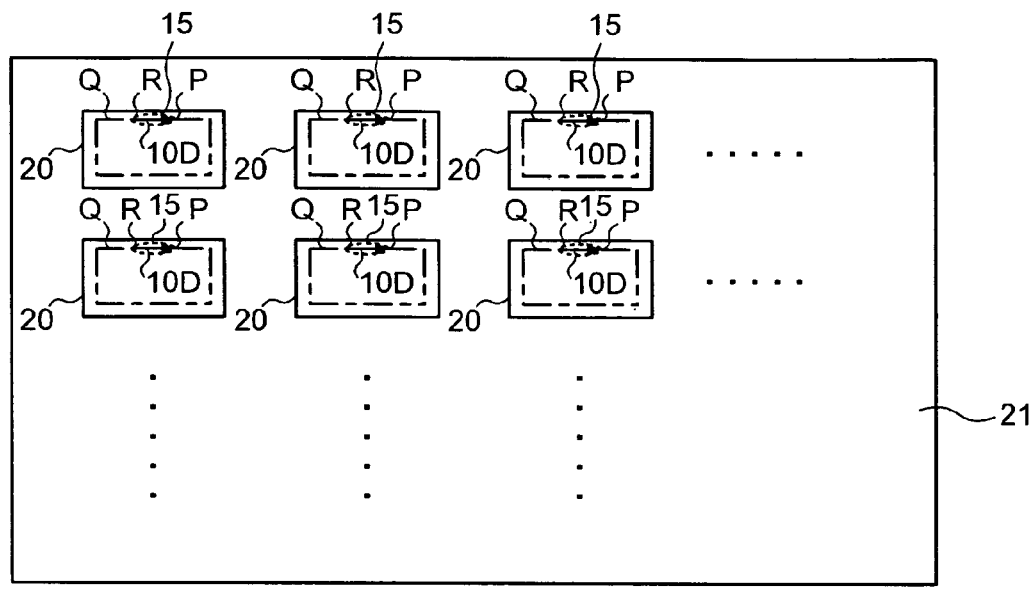
FIG. 18 is a schematic plan view illustrating the method of manufacturing the plural packages simultaneously by applying the manufacturing method of FIG. 10.

Next, as shown in FIG. 17, the annealing process at step S204 (see FIG. 10) illustrated in FIG. 13 is performed. In this case as well, similarly to the first beam irradiation process at step S203a (see FIG. 10) of above, the electron beam 10C is irradiated sequentially to the plural adjacent packages 20 arranged in the same column or in the same row respectively, and, after one column or one row is completed, the electron beam 10C is irradiated further to the adjacent column or row in a similar manner. Thereby, it becomes possible that each of the plural packages 20 is subjected to the annealing treatment.

In such annealing process at step S204, the plural packages 20 are irradiated sequentially with the electron beam 10C, so that it becomes possible to discharge the gas derived from the volatile component adhered to the housing 2 and the lid 3 generated by the annealing treatment from the unwelded section 15 while the electron beam 10C is irradiated to the other packages 20. Consequently, it is not necessary to provide the separate gas discharging process and to take time for it, and it becomes possible to perform the gas discharging process at step S205 (see FIG. 10) and the annealing process at step S204 simultaneously.

In addition, since the processed package 20 can be naturally cooled while processing the other packages 20, it is not necessary to provide the separate cooling process of the package 20 and to take time for it. Consequently, the improvement in the manufacturing efficiency of the package 20 is achieved. More specifically, although the conventional annealing treatment performed using the heating furnace has a problem that a tray which carries the package is also heated and thus the package cannot be cooled to the temperature at which the beam welding can be performed without performing a special cooling process, the packages 20 in the present invention are heated respectively by irradiating the beam to the single package 20 without heating a jig such as the tray, so that the package 20 after the annealing treatment can be naturally cooled in a short time.

After forming the unwelded section 15 in each package 20 and performing the annealing treatment as described above, as shown in FIG. 18, the unwelded section 15 of each package 20 is scanned and irradiated with the electron beam 10D, to perform the secondary welding process at step S206 (see FIG. 10) illustrated in FIG. 14. In this case as well, similarly to the first beam irradiation process at step S203 (see FIG. 10) of above, the electron beam 10D is scanned and irradiated sequentially to the plural adjacent packages 20 arranged in the same column or in the same row respectively, and, after one column or one row is completed, the electron beam 10D is scanned and irradiated further to the adjacent column or row in a similar manner. Thereby, the unwelded sections 15 of the respective packages 20 are welded sequentially, and packages 20 are sealed completely.

Note herein that, although the case where the electron beam 10D is used in the secondary welding step S206 is described above, the type of the beam is not limited thereto and the welding may be performed by the laser.

In addition, although the case where the electron beam 10C is scanned so as to trace the locus of the electron beam 10A in the annealing process at step S204 is described above, it is not limited thereto and the annealing treatment may be performed by irradiating the external surface of the bottom wall of the housing 2 with the laser. In this case, the laser may be irradiated in the shape of a spot to a predetermined area on the external surface of the bottom wall of the housing 2, or may be scanned to perform the beam irradiation.

According to the manufacturing method as described above, with the annealing treatment in the annealing process at step S204 (see FIG. 10), it becomes possible to effectively discharge the gas within the package 20 to the outside, including the gas derived from the volatile component adhered to the housing 2 or the lid 3. Consequently, the improvement in the degree of vacuum in the package 20 is achieved as in the case of the first embodiment.

Moreover, in the primary welding process at step S203 (see FIG. 10) here, the electron beam is irradiated twice so that the unwelded section 15 can be formed with both ends constituted by the starting points of the beam irradiation, enabling the unwelded section 15 to be formed precisely. As a result, the unwelded section 15 with a desired width W can be formed at a desired position, and the width W of the unwelded section 15 can be reduced as compared to the conventional case.

Consequently, since the unwelded section 15 is not sealed accidentally in an attempt to reduce the width W of the unwelded section 15 and the width W of the unwelded section 15 is smaller compared to the conventional case, it becomes possible to reduce the generation amount of the gas in welding in the secondary welding process at step S206 (see FIG. 10). As a result, the improvement in the degree of vacuum in the package 20 is achieved further.

Moreover, since the degree of vacuum in the package 20 is improved as above, it becomes possible to maintain the degree of vacuum in the package 20 at 13 Pa or below, thus enabling to prevent the degradation in the characteristics or reliability of the quartz oscillator 1 under the influence of the gas generated upon welding. As a result, the quartz-oscillator package 20 which has the good characteristics and the stable reliability can be achieved. Specifically, in the package 20 manufactured by the manufacturing method, it becomes possible to achieve the reduction in an equivalent series resistance value (CI value) of the quartz oscillator 1, and the quartz-oscillator package 20 which has the uniform quality and the stable oscillation property becomes realizable.

Moreover, as shown in FIG. 13, in the annealing process at step S204 (see FIG. 10) of the above-described method, the electron beam 10C is scanned so as to trace the locus of the electron beam 10A formed in the primary welding process at step S203 (see FIG. 10), so that the locus of the electron beam 10C coincides with the locus of the electron beam 10A, resulting in that the good appearance of the finished package 20 becomes realizable.

Furthermore, since the annealing treatment in the annealing process at step S204 is performed using the electron beam 10C in a similar manner to the primary welding process at step S203 which uses the electron beams 10A and 10B, it is possible to perform the annealing process at step S204 and the primary welding process at step S203 within the same processing chamber using the same electron beam machining device. Consequently, it is not necessary to provide a separate arrangement for the annealing treatment (for example, an anterior chamber or a posterior chamber of a sealing processing chamber, which is required conventionally), resulting in the reduction in the apparatus cost. In addition, since the primary welding process and the annealing process at step S204 can be performed continuously in the processing chamber at the vacuum state, it becomes possible to achieve the improvement in the manufacturing efficiency while performing the discharge of the gas effectively.

Note that the manufacturing method of the plural packages 20 simultaneously is not limited to that described above. For example, although there is described above where, after forming the unwelded section 15 in each of the plural packages 20, the annealing treatment is performed for the each package 20, the formation of the unwelded section 15 and the annealing treatment may be performed continuously for one package 20 and then the unwelded section 15 of another package 20 may be formed.

In this case, with the package 20 for which the annealing treatment is performed, the gas can be discharged efficiently including the gas derived from the volatile component adhered to the housing 2 while the processing of other packages 20 is performed. Consequently, it becomes possible to shorten the time required to discharge the gas (i.e., the time required in step S205 of FIG. 10) while achieving the effective gas discharge.

Alternatively, the primary welding process at step S203, the annealing process at step S204, the gas discharging process at step S205, and the secondary welding process at step S206 (see FIG. 10) may be performed continuously for one package 20, and, after one package 20 is completed, the next package 20 may be processed.

Fourth Embodiment

Figure 19:
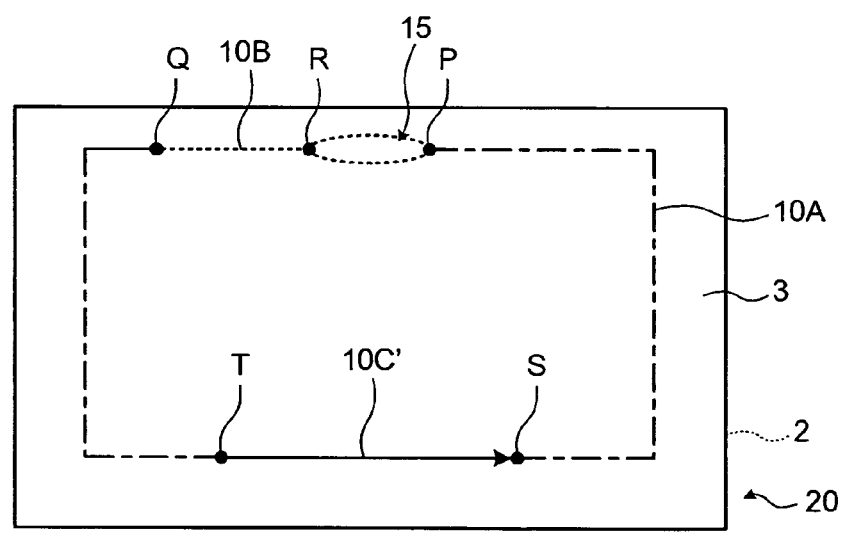
FIG. 19 is a schematic plan view for explaining the electron beam irradiation method in the manufacturing method of the package according to a fourth embodiment of the present invention.

FIG. 19 is a schematic plan view for explaining the electron beam irradiation method of the annealing process in the manufacturing method of the package according to a fourth embodiment of the present invention, illustrating the locus of the electron beam irradiated to the package.

As shown in FIG. 19, in the present embodiment, the irradiation direction of an electron beam 10C' irradiated in the annealing process at step S204 (see FIG. 10) is opposed to the irradiation direction of the electron beam 10C of the first embodiment (see FIG. 13).

In other words, in the present embodiment, the electron beam 10C' is irradiated from the point T on the locus of the electron beam 10A as the starting point to the point S as the terminal point. In the present embodiment of this constitution as well, the effect similar to the effect described above in the third embodiment is acquired.

Fifth Embodiment

Figure 20:
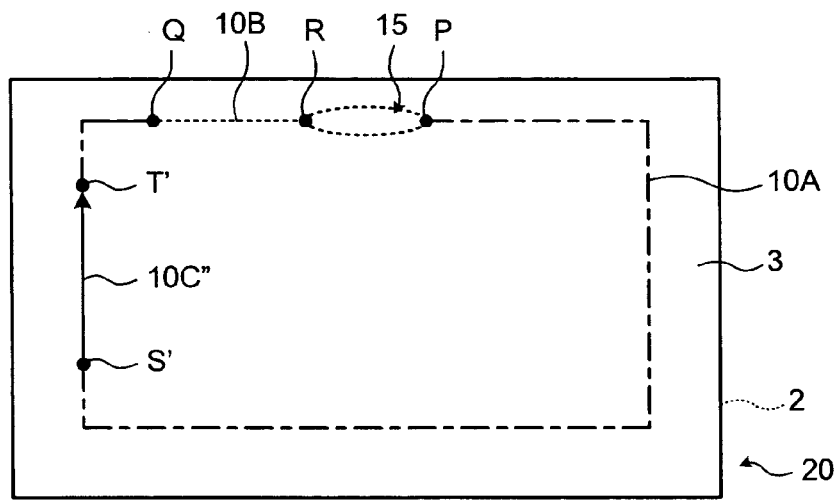
FIG. 20 is a schematic plan view for explaining the electron beam irradiation method in the manufacturing method of the package according to a fifth embodiment of the present invention.

FIG. 20 is a schematic plan view for explaining the electron beam irradiation method of the annealing process in the manufacturing method of the package according to a fifth embodiment of the present invention, illustrating the locus of the electron beam irradiated to the package.

As shown in FIG. 20, in the present embodiment, the irradiation position of an electron beam 10C" in the annealing process at step S204 (see FIG. 10) is different from the irradiation position of the electron beam 10C of the first embodiment.

Specifically, the electron beam 10C" is scanned on the locus of the electron beam 10A from a point S' on the locus of the electron beam 10A formed on one of a pair of the short sides, which is closer to the point Q, of the package 20 as the starting point to a point T' as the terminal point. In this case, the scanning distance of the electron beam 10C" may be the same as or may be different from the scanning distance of the electron beam 10C of the first embodiment. Here, the scanning distance is the same. In the present embodiment of this constitution as well, the effect similar to the effect described above in the first embodiment is acquired.

As is obvious from the third through fifth embodiments, the scanning position of the electron beam of the annealing process at step S204 (see FIG. 10) in the manufacturing method of the package of the present invention may be on any of the trajectories of the electron beam 10A and the electron beam 10B formed in the primary welding process at step S203 (see FIG. 10) as long as it is other than the unwelded section 15 (see FIG. 12) and its neighboring area, or it may span both of the locus of the electron beam 10A and the locus of the electron beam 10B. Note herein that, when scanning the neighboring area of the unwelded section 15 by the electron beam 10C in the annealing process at step S204, it may affect the unwelded section 15.

Sixth Embodiment

Figure 21:
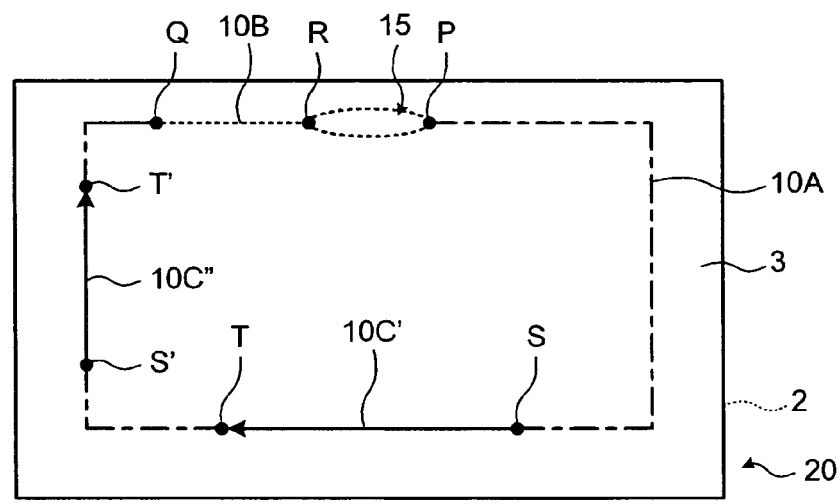
FIG. 21 is a schematic plan view for explaining the electron beam irradiation method in the manufacturing method of the package according to a sixth embodiment of the present invention.

FIG. 21 is a schematic plan view for explaining the electron beam irradiation method of the annealing process in the manufacturing method of the package according to a sixth embodiment of the present invention, illustrating the locus of the electron beam irradiated to the package.

As shown in FIG. 21, in the present embodiment, in the annealing process at step S204 (see FIG. 10), the electron beam 10C' and the electron beam 10C" are scanned so as to trace two areas on the locus of the electron beam 10A formed in the primary welding process at step S203 (see FIG. 10). For example, after irradiating the electron beam 10C' in a similar manner to the above-described third embodiment, the electron beam 10C" is irradiated in a similar manner to the above-described fifth embodiment.

In the present embodiment of this constitution as well, the effect similar to the effect described above in the third embodiment is acquired. Note that the present embodiment is an example of the constitution where, in the annealing process at step S204 (see FIG. 10), plural areas on the locus of the electron beam 10A are irradiated with the electron beams 10C' and 10C", and the combination of the irradiation positions of the electron beams 10C' and 10C" is not limited thereto. In addition, the scanning directions of the electron beams 10C' and 10C" at the respective irradiation positions are also not limited thereto. Moreover, the beam irradiation may be performed to two or more positions.

Furthermore, in the third through sixth embodiments described above, the position of the point Q as the terminal point in the first and second beam irradiation process steps S203a and S203b (see FIG. 10) of the primary welding process at step S203 (see FIG. 10) is not limited to the position illustrated in FIG. 11, and the position of the point Q is not particularly limited as long as it is in the upper stream in the scanning direction of the electron beam 10A than the point R.

Hereinafter, an embodiment will be described where the point Q as the terminal point of the first and second beam irradiation processes (steps 203a and S203b in FIG. 10) is at the position other than the above.

Note herein that, although there is illustrated here the case where the annealing process at step S204 (see FIG. 10) is in the constitution of the third embodiment, the constitution of the annealing process at step S204 is not limited thereto and it may be any of the fourth through sixth embodiments.

Seventh Embodiment

FIGS. 22 through 25 are schematic plan views for explaining the electron beam irradiation method in the primary welding process, the annealing process, and the secondary welding process of the manufacturing method of the package according to a seventh embodiment of the present invention, illustrating the locus of the electron beam irradiated to the package.

Although, as shown in FIGS. 22 through 25, the present embodiment forms the unwelded section 15 by irradiating the electron beam twice, i.e., the electron beams 10A and 10B in the first and second beam irradiation process steps S203a and S203b (see FIG. 10) as with the third embodiment in the primary welding process at step S203 (see FIG. 10), the position of the point Q' as the terminal point in the first beam irradiation process at step S203a is different from that in the third embodiment.

Figure 22:
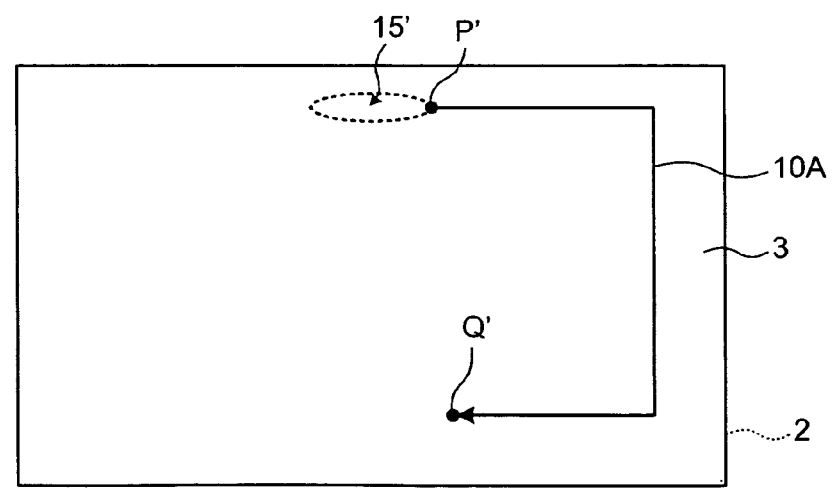
FIG. 22 is a schematic plan view for explaining the electron beam irradiation method in the primary welding process of the manufacturing method of the package according to a seventh embodiment of the present invention.

In other words, as shown in FIG. 22, in the present embodiment, the electron beam 10A is irradiated in the first beam irradiation process at step S203a (see FIG. 10) from the point P' which is one end of the unwelded section formation area 15' (i.e., the point to be one end of the unwelded section 15) as the starting point. The electron beam 10A is then scanned sequentially along the rim of the rid 3 in a rectangular shape in the clockwise direction to reach the point Q' arranged on the other long side opposed to the long side of the lid 3 where the point P' is arranged. In the present embodiment, this point Q' becomes the terminal point of the first beam irradiation process at step S203a (see FIG. 10).

Figure 23:
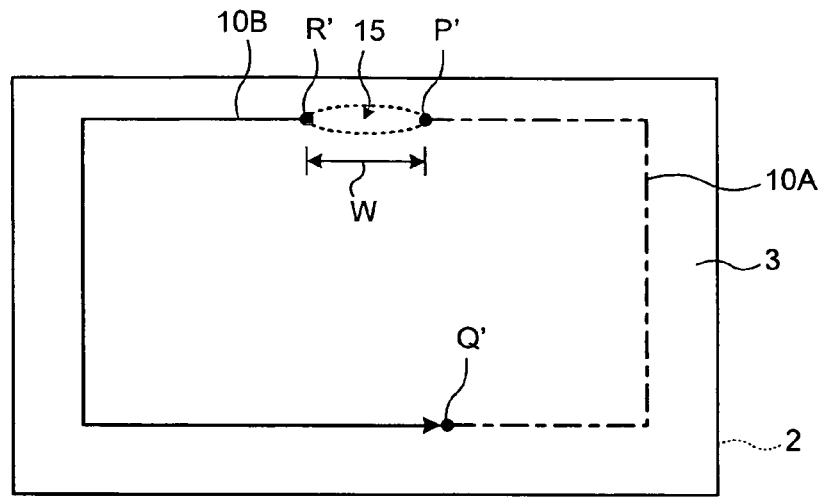
FIG. 23 is a schematic plan view for explaining the electron beam irradiation method in the primary welding process of the manufacturing method of the package according to the seventh embodiment of the present invention.
Figure 24:
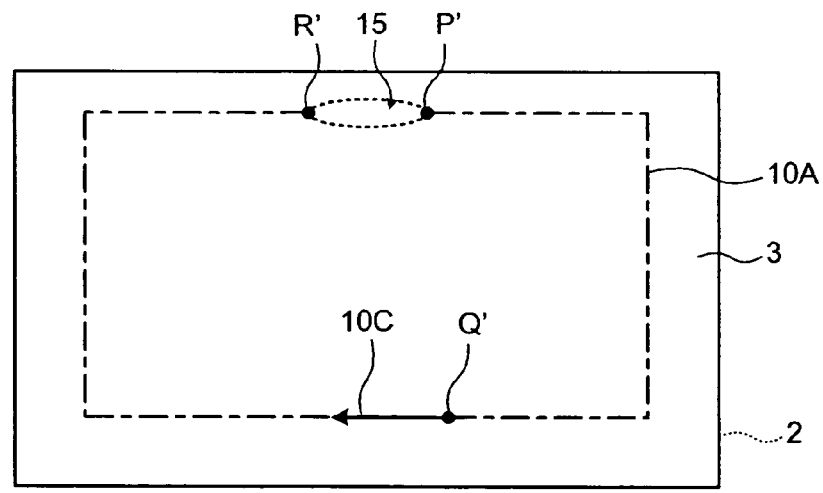
FIG. 24 is a schematic plan view for explaining the electron beam irradiation method in a third beam irradiation process of the manufacturing method of the package according to the seventh embodiment of the present invention.

Next, as shown in FIG. 23, as with the third embodiment, in the second beam irradiation process at step S203b (see FIG. 10), the electron beam 10B is irradiated from the point R' which is the other end of the unwelded section formation area 15' (i.e., the point to be the other end of unwelded section 15) as the starting point, and then scanned sequentially along the rim of the lid 3 toward the above-described point Q' in the direction opposed to the beam scanning direction of the first beam irradiation process at step S203a (see FIG. 10), i.e., in the counterclockwise direction.

Note herein that, although the point Q' is set as the terminal point of the second beam irradiation process at step S203b here, a predetermined point beyond the point Q' and closer to the point P' than the point Q' in the lower stream in the beam scanning direction may be set as the terminal point. By such second beam irradiation process at step S203b, it becomes possible, as with the third embodiment, to form the unwelded section 15 precisely with a desired width W and a desired position.

After forming the unwelded section 15 as described above, as shown in FIG. 24, as with the third embodiment, the electron beam 10C is scanned so as to trace the locus of the electron beam 10A formed in the second beam irradiation process at step S203b (see FIG. 10). Thereby, the annealing treatment is performed by the electron beam 10C (the annealing process at step S204 of FIG. 10).

As described above in the third embodiment, by this annealing treatment, the gas generated in the welding of the above-described primary welding process at step S203a (see FIG. 10) and the gas derived from the volatile component adhered to the housing 2 are discharged outside from the interior of the package 20 via the unwelded section 15 as the opening (the gas discharging process at step S205 of FIG. 10).

Figure 25:
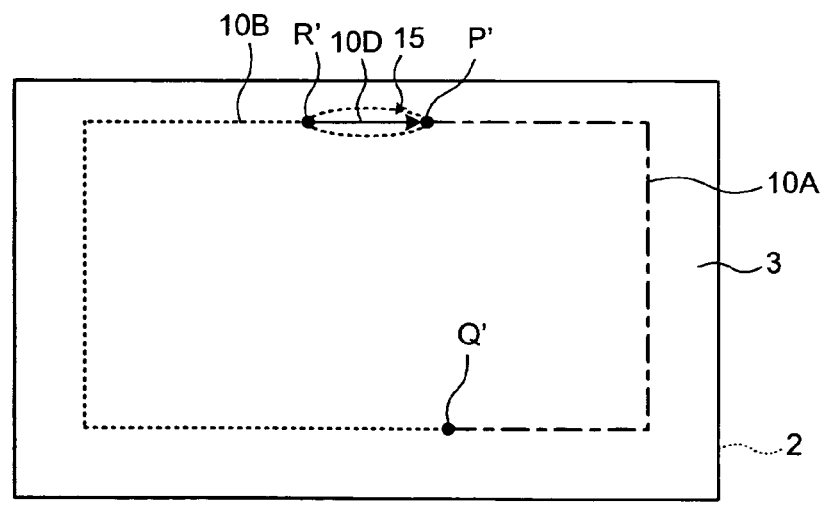
FIG. 25 is a schematic plan view for explaining the electron beam irradiation method in the secondary welding process of the manufacturing method of the package according to the seventh embodiment of the present invention.

After discharging the gas for a predetermined time, the electron beam 10D is irradiated to the unwelded section 15 to melt the sealing material 4 in the unwelded section 15 so as to seal (i.e., secondary welding) the package 20 completely (the secondary welding process at step S206 of FIG. 10). In such secondary welding process at step S206, as shown in FIG. 25, the electron beam 10D is scanned from the point R' as one end of the unwelded section 15 toward the point P' as the other end thereof in the identical direction to the beam scanning direction of the first electron beam irradiation process at step S203a (see FIG. 10) to perform the beam irradiation. In fact, since the distance between the points P' and R' is approximately 0.5 mm, the welding can be performed by irradiating the laser instead of the electron beam 10D in the shape of a spot.

Note herein that, although there is described above the case where the secondary welding process at step S206 (see FIG. 10) is performed using the electron beam 10D, the type of the beam is not limited thereto and the welding may be performed by the laser.

In the present embodiment of this constitution as well, the effect similar to the effect described above in the third embodiment is acquired. Note herein that, although the same effect is acquired in the present embodiment and the third embodiment in that the quartz oscillator with the good characteristics and the stable reliability can be realized, the third embodiment can realize the more preferred efficiency percentage with regard to the hermetic sealing property in an area other than the unwelded section 15. As for the hermetic sealing property in other than the unwelded section 15, the four corners of the lid 3 are preferably sealed continuously in a single welding process.

Eighth Embodiment

Figures 26, 27:
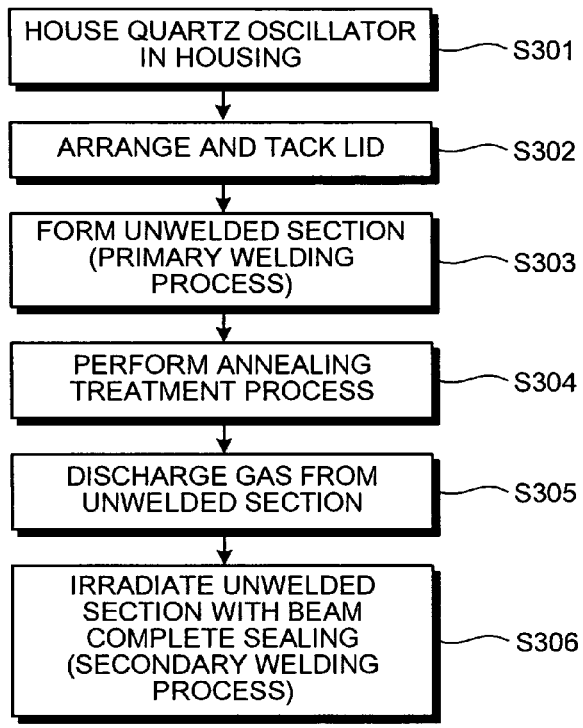
FIG. 26 is a flowchart illustrating the respective processes in the manufacturing method of the package according to an eighth embodiment of the present invention.
FIG. 27 is a diagram illustrating a result of an example and a comparative example.
Figure 28:
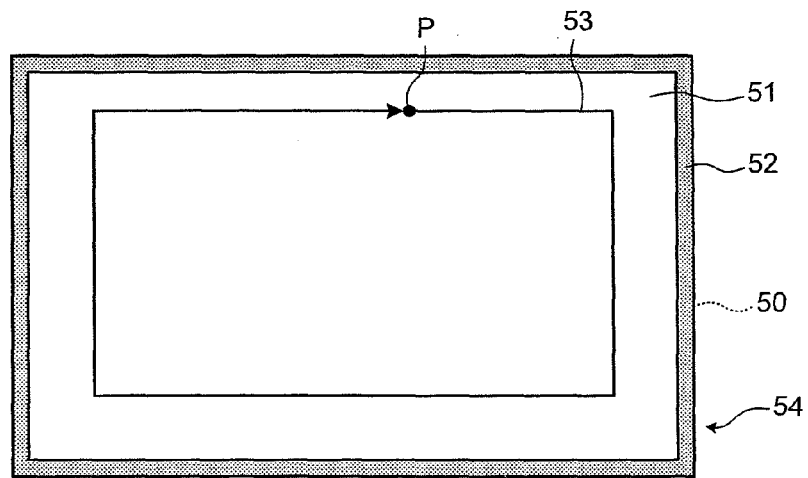
FIG. 28 is a schematic plan view illustrating an example of a conventional manufacturing method of the package.

FIG. 26 is a flowchart illustrating the respective processes in the manufacturing method of the package according to an eighth embodiment of the present invention. As shown in FIG. 26, the package manufacturing method of the present embodiment is different in that the unwelded section is formed by a single beam irradiation in the primary welding process at step S303, i.e., the primary welding process at step S303 is one process, from the third embodiment where the primary welding process at step S303 is two processes (steps S203a and S203b).

In other words, in the manufacturing method of the package of the present embodiment, as shown in FIG. 26, as with the case of the third embodiment, the quartz oscillator 1 is housed in the housing 2 of FIG. 2 (step S301), and then the lid 3 and the housing 2 are tacked (step S302) by the method described above in step S102 (see FIG. 1) of the first embodiment. After tacking the lid 3 at housing 2 as above, the electron beam 10A is then irradiated from the lid 3 side to scan the electron beam 10A once from the point P to the point R of FIG. 11 as the starting point and the terminal point, respectively, along the rim of the lid 3. Thereby, the unwelded section 15 is formed between the points P and Q (the primary welding process at step S303).

After the above-described primary welding process at step S303, as with the annealing process at step S204 (see FIG. 10) of the third embodiment, as shown in FIG. 13, the electron beam 10C is irradiated to subject to the annealing treatment (the annealing process at step S304). Then, by the method similar to step S205 (see FIG. 10) of the third embodiment, the gas generated in the primary welding process at step S303 and the gas derived from the volatile component generated in the annealing process at step S304 are discharged from the unwelded section 15 (see FIG. 13) (step S305). In addition, as with step S206 of the third embodiment, as shown in FIG. 14, the electron beam 10D is irradiated to the unwelded section 15 to weld the unwelded section 15 so as to seal completely (the secondary welding process at step S306). Note that the laser may be used instead of the electron beam 10D.

In the present embodiment of this constitution, the formation precision of the unwelded section 15 is degraded as compared to such as the third embodiment which forms the unwelded section 15 by irradiating the beam twice, leading to the width W of the unwelded section 15 formed becoming larger than that in such as the third embodiment. However, in the present embodiment, it is possible by the annealing process S304 using the electron beam 10C to efficiently remove the gas generated in the primary welding process S303 or the gas generated in the annealing treatment, thereby the high degree of vacuum in the manufactured package 20 of FIG. 2 can be achieved. Accordingly, the effect similar to the effect described above in the first embodiment is acquired.

Ninth Embodiment

While in the above-described third through eighth embodiments, as shown in FIGS. 13, 19, 20, and 21, the scanning positions of the electron beams 10C, 10C', and 10C" in the annealing process steps S204 (see FIG. 10) and S304 (see FIG. 26) are set other than the unwelded section 15 (see FIG. 12) and its neighboring area to scan either of the trajectories of the electron beam 10A and the electron beam 10B formed in the primary welding process steps S203 (see FIG. 10) and S303 (see FIG. 26) or both of the locus of the electron beam 10A and the locus of the electron beam 10B, the beam irradiation may be performed to the area other than, for example, on the trajectories of the electron beam 10A and the electron beam 10B (i.e., the primary-welded section).

For example, the manufacturing method of the package according to a ninth embodiment of the present invention, in the annealing process at step S204 of FIG. 10 or in the annealing process at step S304 of FIG. 26, performs the beam irradiation to a predetermined area of the bottom wall or the side wall of the housing 2, as shown in FIG. 3 or 4, in accordance with the method described above in the first embodiment. In the annealing treatment in this case, in order to reduce the damage to the housing 2 or the lid 3, the electron beam or the laser with the low output value is used. In the present embodiment of this constitution as well, the effect similar to the effect described above in the third through seventh embodiments is acquired.

The above-described first through ninth embodiments are illustrations of the package manufacturing method according to the present invention, and the present invention is not limited to the first through ninth embodiments. For example, while in the above-described third through ninth embodiments, as shown in FIGS. 10 and 26, the annealing process steps S204 and S304 are performed after performing the primary welding process steps S203 and S303, the annealing process steps S204 and S304 may be performed before the primary welding process steps S203 and S303. In addition, for example, in the third through seventh embodiments, the annealing process S204 may be performed between the first beam irradiation process at step S203a and the second beam irradiation process at step S203b of the primary welding process at step S203 of FIG. 10.

Here, as with the third through ninth embodiments, when the annealing process steps S204 and S304 are performed after performing the primary welding process steps S203 and S303 illustrated in FIGS. 10 and 26 to form the unwelded section 15, it becomes possible to discharge more efficiently the gas generated from such as the sealing material 4 in the primary welding process steps S203 and S303 through the unwelded section 15 to the outside. Therefore, the effect of the present invention is achieved more effectively.

Moreover, although in the above-described third through seventh embodiments, in the primary welding process at step S203 illustrated in FIG. 10, the electron beam 10A is scanned in the first beam irradiation process at step S203a (see FIG. 10) as shown in FIG. 11 along the rim of the lid 3 in the clockwise direction, and the electron beam 10B is then scanned in the second beam irradiation process at step S203b (see FIG. 10) as shown in FIG. 12 in the counterclockwise direction, the scanning direction of the electron beam is not limited thereto as long as the scanning directions of the electron beams in the first beam irradiation process at step S203*a* and the second beam irradiation step S203*b* (see FIG. 10) oppose to each other. The scanning direction of the electron beam is suitably set, in consideration of the relationship with a mount of the quartz oscillator 1 or the arrangement position of the opening edge of the tuning fork shape as well, so that the good characteristics of the quartz oscillator 1 can be achieved. The scanning direction of the electron beam 10D in the secondary welding process at step S206 (see FIG. 10) is not also limited to the direction illustrated in FIG. 14.

In addition, the formation position of the unwelded section 15 is not limited to the position in the above-described third through seventh embodiments, and it may be the position other than this. The formation position of the unwelded section 15 is suitably set in consideration of such as the discharge efficiency of the gas.

Moreover, while in the above-described third through ninth embodiments, the beam 10D irradiated in the secondary welding process at step S206 (see FIG. 10) may be either of the electron beam and the laser as described above, in the third to seventh, and ninth embodiments, for example, because it is possible to reduce the width W of the unwelded section 15 as described above, the laser with a small beam spot diameter is suitable for sealing the unwelded section 15 (i.e., a point sealing).

Furthermore, while in the above-described third through eighth embodiments, the electron beam 10C is irradiated once in the annealing process at step S204 of FIG. 10 and the annealing process at step S304 of FIG. 26, the electron beam 10C may be irradiated intermittently and repeatedly in multiple times. For example, the electron beam 10C may be irradiated intermittently in multiple times, followed by leaving the package 20 for 2 to 60 seconds to discharge the gas (the gas discharging process at step S205 of FIG. 10 and the gas discharging process at step S305 of FIG. 26).

Furthermore, in the above-described third through ninth embodiments, upon irradiating the electron beams 10A and 10B in the primary welding process at step S203 of FIG. 10 and the primary welding process at step S303 of FIG. 26, the electron beam 10A and 10B with the high output value may be irradiated at once so as to trace the above-described locus to weld the lid 3 and the housing 2, or the electron beams 10A and 10B with the low output value may be irradiated one time or in multiple times so as to trace the above-described locus to heat the housing 2, the lid 3, and the sealing material 4, and then the electron beams 10A and 10B with the high output value may be irradiated to melt the sealing material 4 so as to weld the lid 3 and the housing 2.

Although, in the above-described first through ninth embodiments, there is described the case where the sealed electronic component (package 20) according to the present invention houses the tuning fork type quartz oscillator 1 in the housing 2, the quartz oscillator other than this may be housed. In addition, the present invention is applicable as well to the sealed electronic component with a constitution to house the electronic component other than the quartz oscillator 1. For example, the present invention may be applied to the sealed electronic component which houses such as a piezoelectric vibrator, an integrated circuit, or an SWA filter in the housing. Moreover, the manufacturing method according to the present invention is applicable as well to the sealed electronic component which has a shape other than the square shape.

EXAMPLE

In an example, the quartz-oscillator package 20 of FIG. 2 was manufactured according to the manufacturing method illustrated in the above-described third embodiment. In a comparative example, the quartz-oscillator package 20 of FIG. 2 was manufactured according to the manufacturing method illustrated in FIGS. 29 and 30 without performing the annealing treatment by the electron beam irradiation. As for the quartz-oscillator packages 20 of the example and the comparative example, the amounts of increase in the equivalent series resistance CI values and average CI values after baking have been measured. Hereinafter, the details will be explained.

Example

In the example, according to the method described above in the third embodiment, the quartz-oscillator package 20 of FIG. 2 has been manufactured by performing the primary welding process illustrated in FIGS. 11 and 12 (step S203 of FIG. 10), the annealing process illustrated in FIG. 13 (step S204 of FIG. 10), and the secondary welding process illustrated in FIG. 14 (step S206 of FIG. 10).

Comparative Example

In the comparative example, the unwelded section 55' is formed according to the method illustrated in FIG. 29. Then, the unwelded section 55' has been sealed according to the method illustrated in FIG. 30 to manufacture the quartz-oscillator package 54.

The respective quartz-oscillator packages 20 manufactured as described above have been heated in a baking furnace at 150 degrees C. for 12 hours in the ambient atmosphere. Thereafter, the amounts of increase in the equivalent series resistance CI values and the average CI values after baking have been measured.

FIG. 27 is a measurement result of the equivalent series resistance CI values after baking of the quartz-oscillator packages 20 manufactured by the methods of the example and the comparative example.

As shown in FIG. 27, in the quartz-oscillator package 20 manufactured by the example method according to the manufacturing method of the present invention, the increase in the CI value due to the baking as well as the average CI values are smaller compared to those of the quartz-oscillator package 20 manufactured by the method of the comparative example. Particularly, in the example, the increase in the CI value as well as the average CI value has been small.

Since a baking test represents thermal resistance and reliability of the quartz-oscillator package 20, the result exhibits that the quartz-oscillator package 20 of the example has the good thermal resistance and reliability compared to those of the quartz-oscillator package 20 of the comparative example, and the effect thereof is remarkable in the quartz-oscillator package 20 of the example.

INDUSTRIAL APPLICABILITY

As has been described, the manufacturing method of the sealed electronic component and the sealed electronic component manufactured by the method according to the present invention are useful in realizing the sealed electronic component with the interior being maintained at the high-vacuum state and with the high manufacturing efficiency, and, in particular, are suitable for manufacturing the sealed electronic component where the vacuum state of the interior thereof considerably affects the characteristics or reliability of the device housed therein, for example, the sealed electronic component housing such as the quartz oscillator.

The invention claimed is:

1. A method of manufacturing a sealed electronic component, comprising:
    disposing, on a rim of an opening of a housing of an electronic component, sealing material for joining the housing and a lid that covers the opening of the housing;
    performing an annealing process by irradiating only the housing with a beam; and
    melting the sealing material to join the housing and the lid.

2. The method of manufacturing the sealed electronic component according to claim 1, wherein at least one point of a bottom wall of the housing is irradiated with the beam.

3. The method of manufacturing the sealed electronic component according to claim 1, wherein at least one point of one of side walls of the housing is irradiated with the beam.

4. The method of manufacturing the sealed electronic component according to claim 1, wherein at least one point of each of a plurality of side walls of the housing is irradiated with the beam.

5. The method of manufacturing the sealed electronic component according to claim 1, wherein the beam is irradiated intermittently.

6. The method of manufacturing the sealed electronic component according to claim 1, wherein the beam is a laser.

7. The method of manufacturing the sealed electronic component according to claim 1, wherein
    the housing and the lid are joined by melting the sealing material without sealing a through hole formed in the housing or between the housing and the lid before the annealing process, and
    the through hole is sealed after the annealing process.

8. The method of manufacturing the sealed electronic component according to claim 7, further comprising
    filling the through hole formed in the housing with through hole sealing material before or after the annealing process, wherein
    the through hole is sealed by the through hole sealing material that is irradiated with a beam and melted.

9. The method of manufacturing the sealed electronic component according to claim 8, wherein
    the through hole is disposed on a bottom wall of the housing on which an externally connected electrode is disposed, and
    an area of the bottom wall other than where the through hole and the externally connected electrode are disposed is irradiated with the beam in the annealing process.

10. A method of manufacturing a sealed electronic component, comprising:
    disposing, on a rim of an opening of a housing of an electronic component, sealing material for joining the housing and a lid that covers the opening of the housing;
    first-welding the housing and the lid by irradiating a part of a joining portion of the housing and the lid with a first beam so as to melt a part of the sealing material, while leaving the rest of the joining portion as an unwelded section;
    performing an annealing process by irradiating only the lid with a second beam; and
    second-welding the housing and the lid by irradiating the unwelded section with a third beam so as to melt the rest of the sealing material, after a predetermined time is elapsed for discharging a gas within the housing from the unwelded section.

11. The method of manufacturing the sealed electronic component according to claim 10, wherein the second beam is irradiated by the same beam device as the first beam, and irradiates at least one point on an irradiation locus of the first beam.

12. The method of manufacturing the sealed electronic component according to claim 10, wherein at least the first beam and the second beam are an electron beam or a laser.

13. The method of manufacturing the sealed electronic component according to claim 10, wherein an intensity of the second beam is lower than an intensity of the first beam.

14. The method of manufacturing the sealed electronic component according to claim 10, wherein the first-welding includes at least two irradiations of the first beam so as to form the unwelded section between a starting point of a first irradiation and a starting point of a second irradiation.

15. The method of manufacturing the sealed electronic component according to claim 14, wherein the first-welding comprises:
    scanning the first beam from one end of the unwelded section (hereinafter, "a first point") to a third point located before the other end of the unwelded section (hereinafter, "a second point") in a predetermined direction along a circumference of the lid; and
    scanning the first beam from the second point to the third point in a direction opposite to the predetermined direction along the circumference of the lid.

16. The method of manufacturing the sealed electronic component according to claim 15, wherein
    the housing has a square shape, and
    the first point, the second point, and the third point are set so that four corners of the housing are located between the first point and the third point or between the second point and the third point.

17. The method of manufacturing the sealed electronic component according to claim 15, further comprising tacking the lid to the housing before the first-welding, wherein
    the first point and the second point are positioned in an area other than where the lid is tacked to the housing.

18. The method of manufacturing the sealed electronic component according to claim 10, wherein the third beam is an electron beam or a laser.

19. The method of manufacturing the sealed electronic component according to claim 18, wherein at least one of the first-welding and the second-welding comprises:
    heating the housing, the lid, and the sealing material to a predetermined temperature by irradiating the first beam or the third beam; and
    melting the sealing material by irradiating the first beam or the third beam so as to weld the housing and the lid by the sealing material.

20. The method of manufacturing the sealed electronic component according to claim 19, wherein the heating the housing, the lid, and the sealing material to the predetermined temperature includes at least two irradiations of the first beam or the third beam.

21. A method of manufacturing a sealed electronic component, comprising:
    disposing, on a rim of an opening of a housing of an electronic component, sealing material for joining the housing and a lid that covers the opening of the housing;

joining the housing and the lid by melting the sealing material;

performing an annealing process by irradiating only the housing with a laser after the joining;

filling a through hole formed in the housing with a through hole sealing material before or after the annealing process; and sealing the through hole by irradiating the through hole sealing material with the laser after the filling and the annealing process.

22. A sealed electronic component manufactured by the method of manufacturing the sealed electronic component according to any one of claims 1, 10, and 21.

* * * * *